(12) United States Patent
Inoue et al.

(10) Patent No.: US 7,425,878 B2
(45) Date of Patent: Sep. 16, 2008

(54) SURFACE ACOUSTIC WAVE FILTER AND DUPLEXER USING THE SAME

(75) Inventors: Shogo Inoue, Kawasaki (JP); Toshio Nishizawa, Yokohama (JP); Toshihiko Murata, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 295 days.

(21) Appl. No.: 11/413,202

(22) Filed: Apr. 28, 2006

(65) Prior Publication Data

US 2006/0244550 A1    Nov. 2, 2006

(30) Foreign Application Priority Data

Apr. 28, 2005    (JP) .............................. 2005-130988

(51) Int. Cl.
*H03H 9/64*    (2006.01)
*H03H 9/72*    (2006.01)

(52) U.S. Cl. ........................ 333/133; 333/193; 333/195; 310/313 D

(58) Field of Classification Search .................. 333/193, 333/195

See application file for complete search history.

(56) References Cited

U.S. PATENT DOCUMENTS

| 4,425,554 | A | * | 1/1984 | Morishita et al. | ............ 333/195 |
| 7,138,890 | B2 | * | 11/2006 | Nakamura et al. | .......... 333/195 |
| 7,212,086 | B2 | * | 5/2007 | Nishizawa et al. | .......... 333/193 |

FOREIGN PATENT DOCUMENTS

| JP | 2003-249842 A | 9/2003 |
| JP | 2004-194269 A | 7/2004 |

* cited by examiner

*Primary Examiner*—Barbara Summons
(74) *Attorney, Agent, or Firm*—Arent Fox LLP

(57) ABSTRACT

A multimode type SAW filter includes a piezoelectric substrate, and IDT groups formed on the piezoelectric substrate, the IDT groups each having multiple IDTs connected in series in which an input/output electrode and a ground electrode are coupled via a floating conductor. Adjacent electrode fingers between adjacent IDTs among the multiple IDTs of the IDT groups include a first electrode finger connected to the floating conductor in one of the IDT groups and a second electrode finger connected to one of the input/output electrode and the ground electrode in another one of the IDT groups.

23 Claims, 26 Drawing Sheets

SURFACE ACOUSTIC WAVE FILTER AND DUPLEXER USING THE SAME

BACKGROUND OF THE INVENTION

1. Field of the Invention

The present invention generally relates to surface acoustic wave filters and duplexers using the same, and more particularly to a surface acoustic wave filter in which one IDT (Inter-Digital Transducer) is divided in multiple IDTs connected in series and a duplexer using such a filter.

2. Description of the Related Art

Recently, a filter of a surface acoustic wave device has been employed in the RF circuit of radio equipment such as a portable phone. The filter of the surface acoustic wave device (hereinafter referred to as SAW filter) may be a transmit filter, a receiver filter or an antenna duplexer equipped with the transmit filter and the receive filter that are packaged as a single device.

FIG. 1 is a block diagram of a conventional antenna duplexer used in a portable phone. A transmit signal applied via a transmit terminal 13 passes through a transmit filter 16, and is output via an antenna terminal 14. A receive signal received via the antenna terminal 14 passes through a matching circuit 12 and a receive filter 11, and is output via a receive terminal 15.

Antenna duplexers are disclosed in FIG. 6 of Japanese Patent Application Publication No. 2003-249842 (hereinafter referred to as Document 1) and FIG. 30 of Japanese Patent Application Publication No. 2004-194269 (hereinafter referred to as Document 2). These antenna duplexers have a transmit filter formed by a ladder type SAW filter, and a receive filter formed by a multimode type SAW filter. The transmit filter may receive high power and is therefore formed by the SAW filter having high power durability. The receive filter is required to have a high out-of-band attenuation and a steep cutoff characteristic, and is therefore formed by the multimode type SAW filter.

The basic structure of the multimode type SAW filter is disclosed in, for example, FIG. 5 of Document 2, and is composed of a pair of reflectors formed on a piezoelectric substrate, an input IDT (composed of comb-like electrodes) and an output IDT. The input and output IDTs are interposed between the pair of reflectors. A drive voltage is applied to the input IDT, and resultant SAWs are propagated between the reflectors. There are multiple standing waves between the reflectors. Voltages that correspond to the frequencies of the standing waves appear at the output IDT. The multimode type SAW filter functions as a bandpass filter.

However, the duplexers disclosed in Documents 1 and 2 have the following problems. Referring to FIG. 1, input power of the transmit signal applied via the transmit terminal 13 passes through the transmit filter 16 and reaches the antenna terminal 14, as indicated by the solid-line arrow. However, as indicated by a dotted-line arrow, some input power passes through the matching circuit 12 and reaches the receive filter 11 as leakage power. The multimode type SAW filter has poor power durability, and the leakage power may break the receive filter or may cause non-linearity of the receive filter 11. This degrades the receive sensitivity.

SUMMARY OF THE INVENTION

The present invention has been made in terms of the above-mentioned circumstances, and has an object to provide a multimode type SAW filter having improved power durability and suppressed non-linearity and an antenna duplexer using such a multimode type SAW filter.

According to an aspect of the present invention, there is provided a multimode type SAW filter including: a piezoelectric substrate; and IDT groups formed on the piezoelectric substrate, the IDT groups each having multiple IDTs connected in series in which an input/output electrode and a ground electrode are coupled via a floating conductor, adjacent electrode fingers between adjacent IDTs among the multiple IDTs of the IDT groups including a first electrode finger connected to the floating conductor in one of the IDT groups and a second electrode finger connected to one of the input/output electrode and the ground electrode in another one of the IDT groups.

According to another aspect of the present invention, there is provided a multimode type SAW filter including: a piezoelectric substrate; multiple filters connected in parallel and formed on the piezoelectric substrate; each of the multiple filters including: IDT groups formed on the piezoelectric substrate, the IDT groups each having multiple IDTs connected in series in which an input/output electrode and a ground electrode are coupled via a floating conductor, adjacent electrode fingers between adjacent IDTs among the multiple IDTs of the IDT groups including a first electrode finger connected to the floating conductor in one of the IDT groups and a second electrode finger connected to one of the input/output electrode and the ground electrode in another one of the IDT groups.

According to yet another aspect of the present invention, there is provided a multimode type SAW filter including: a first filter; and a second filter that follows the first filter and is a multimode type SAW filter, the first filter including: IDT groups formed on the piezoelectric substrate, the IDT groups each having multiple IDTs connected in series in which an input/output electrode and a ground electrode are coupled via a floating conductor, adjacent electrode fingers between adjacent IDTs among the multiple IDTs of the IDT groups including a first electrode finger connected to the floating conductor in one of the IDT groups and a second electrode finger connected to one of the input/output electrode and the ground electrode in another one of the IDT groups.

According to a further aspect of the present invention, there is provided an antenna duplexer including: a transmit filter connected to a common terminal; and a receive filter connected to the common terminal, the receive filter including: a piezoelectric substrate; and IDT groups formed on the piezoelectric substrate, the IDT groups each having multiple IDTs connected in series in which an input/output electrode and a ground electrode are coupled via a floating conductor, adjacent electrode fingers between adjacent IDTs among the multiple IDTs of the IDT groups including a first electrode finger connected to the floating conductor in one of the IDT groups and a second electrode finger connected to one of the input/output electrode and the ground electrode in another one of the IDT groups.

BRIEF DESCRIPTION OF THE DRAWINGS

Preferred embodiments of the present invention will be described in detail based on the following figures, in which.

DESCRIPTION OF THE PREFERRED EMBODIMENTS

According to an aspect of the present invention, multiple IDTs connected in series via a floating conductor are provided between an input or output electrode and a ground electrode. With this arrangement, the power durability of the multimode type SAW can be improved.

Figure 2A:
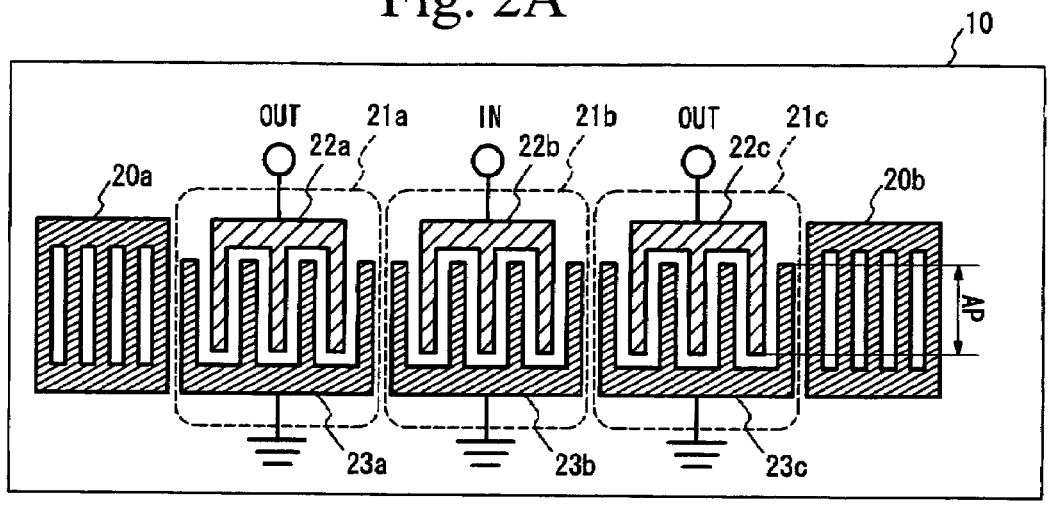
FIG. 2A shows a conventional double mode type SAW (DMS) filter, which is one of the multimode type SAW filters.

FIG. 2A shows a conventional double mode type SAW (DMS) filter, which is one of the multimode type SAW filters. Referring to FIG. 2A, three IDTa $21a$, $21b$ and $21c$ are provided side by side in a SAW propagation direction between reflectors $20a$ and $20b$ on a piezoelectric substrate 10. An input/output electrode $22b$ of the central IDT $21b$ is connected to an input terminal 22, and input/output electrodes $22a$ and $22c$ of the left and right IDTs $21a$ and $21c$ are respectively connected to output terminals. Ground electrodes $23a$, $23b$ and $23c$ of the IDTs $21a$, $21b$ and $21c$ are connected to ground. A symbol AP denotes an aperture length that is the lengths of the interleaving portions of the electrode fingers of the ground and input/output electrodes.

Figure 2B:
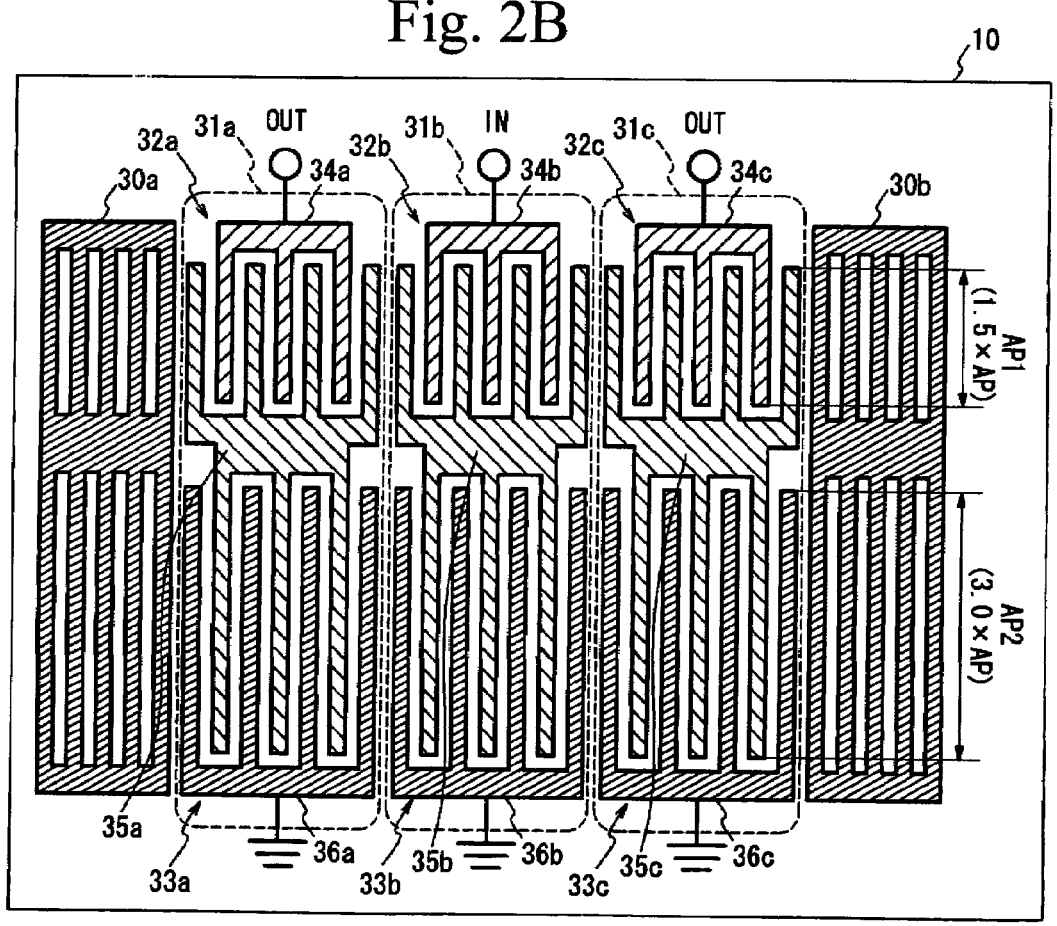
FIG. 2B shows a comparative multimode SAW filter.

FIG. 2B shows a comparative multimode SAW filter, which a double mode type SAW filter having multiple IDT groups, each of which has multiple IDTs connected in series. Referring to FIG. 2B, IDT groups $31a$, $31b$ and $31c$ are provided side by side in a SAW propagation direction between reflectors $30a$ and $30b$. The IDT group $31a$ has IDTs $32a$ and $33a$ connected in series. The IDT $32a$ is composed of an input/output electrode $34a$ and a floating conductor $35a$. The IDT $33a$ is composed of the floating conductor $35a$ and a ground electrode $36a$. Similarly, the IDT group $31b$ has IDTs $32b$ and $33b$ connected in series. The IDT $32b$ is composed of an input/output electrode $34b$ and a floating conductor $35b$. The IDT $33b$ is composed of the floating conductor $35b$ and a ground electrode $36b$. Similarly, the IDT group $31c$ has IDTs $32c$ and $33c$ connected in series. The IDT $32c$ is composed of an input/output electrode $34c$ and a floating conductor $35c$. The IDT $33c$ is composed of the floating conductor $35c$ and a ground electrode $36c$. The aperture length between the input/output electrode and the floating conductor is denoted as AP1, and the aperture length between the floating conductor and the ground electrode is denoted by AP2.

In order to replace the conventional DMS filter shown in FIG. 2A with the comparative DMS filter shown in FIG. 2B, the comparative DMS filter has the same input/output impedances as those of the conventional DMS filter. In order to achieve this impedance relationship, preferably, the composite electrostatic capacitances of the IDT groups $31a$, $31b$ and $31c$ of the comparative DMS filter are respectively equal to those of the IDTs $21a$, $21b$ and $21c$.

In the IDT groups of the comparative DMS filter, it is assumed that the electrostatic capacitance of the upper IDT having the aperture length AP1 is denoted as C1, and the electrostatic capacitance of the lower IDT having the aperture length AP2 is denoted as C2. The composite electrostatic capacitance of each of the IDT groups is expressed as 1/(1/C1+1/C2). Assuming that the electrostatic capacitance of IDT is proportional to the aperture length, the following equation should be satisfied in order to achieve such a relationship that the electrostatic capacitance of the IDT is equal to that of the IDT group:

$$AP1 \times AP2 = (AP1+AP2) \times AP \qquad (1).$$

A series fragmentation is defined as a way to convert one IDT into an IDT group composed of multiple IDTs connected in series. In the comparative filter shown in FIG. 2b, AP1=1.5×AP and AP2=3×AP. The voltage applied to the upper IDT of the comparative filter is equal to 0.66 times the voltage applied to the IDT of the conventional filter, namely, AP2/(AP1+AP2)=0.66. The voltage applied to the lower IDT of the comparative filter is equal to 0.33 times the voltage applied to the IDT of the conventional filter, namely, AP1/(AP1+AP2)=0.33.

When the voltage applied to the IDT is reduced as mentioned above, the strength of SAW per unit area in IDT can be reduced. This improves the power durability and suppresses the non-linearity.

Figure 3A:
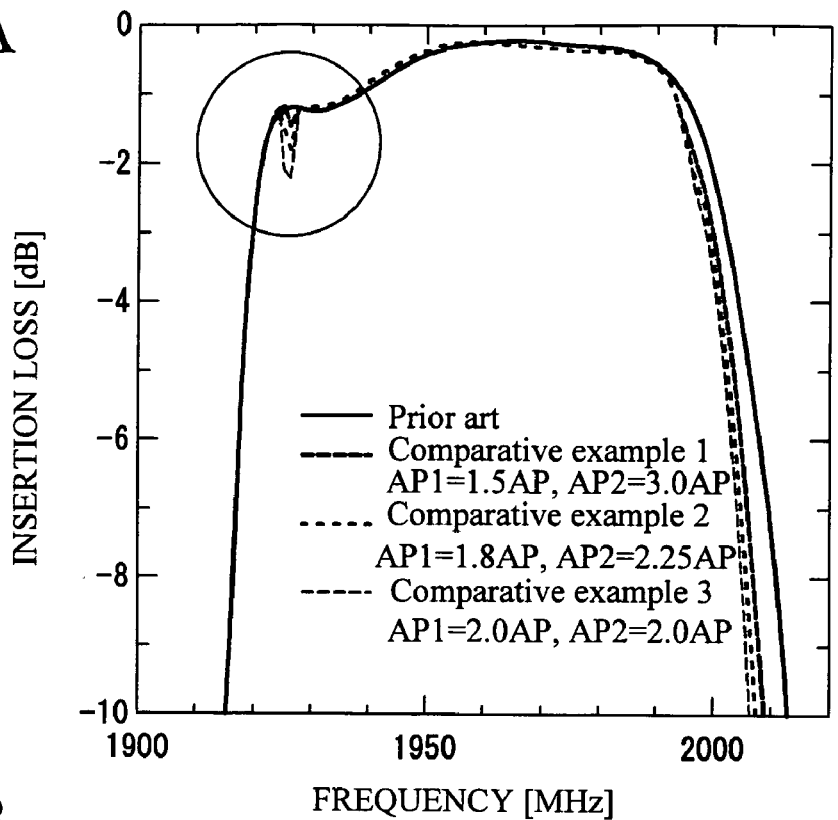
FIG. 3A shows bandpass characteristics of a first comparative filter.
Figure 3B:
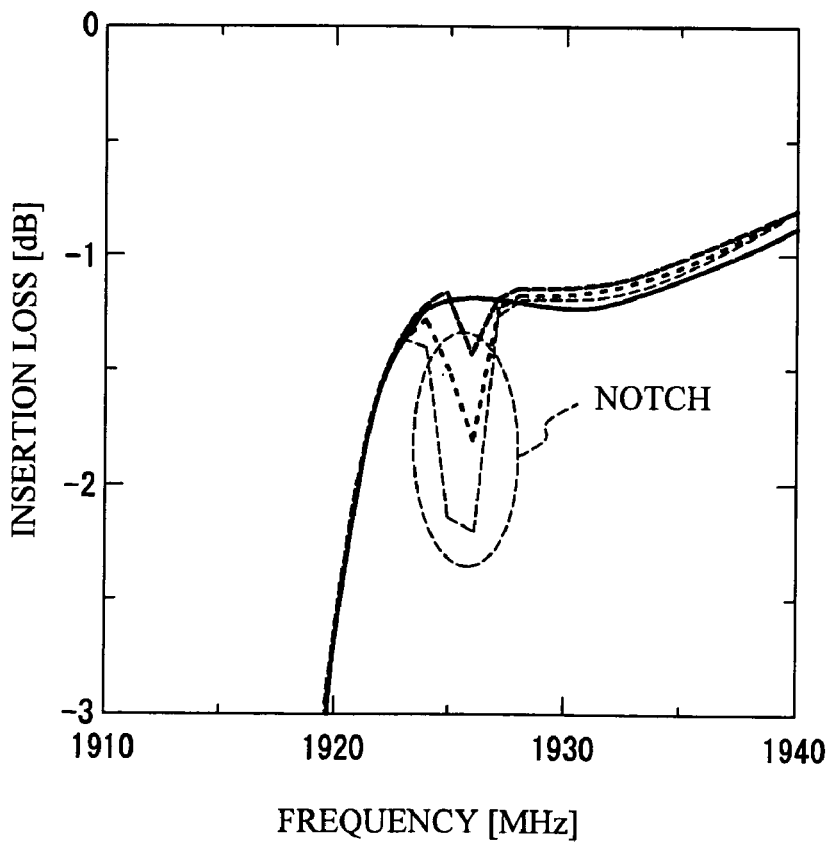
FIG. 3B is an enlarged view of a portion surrounded by a circle shown in FIG. 3A.

The inventors changed the aperture lengths AP1 and AP2 of the comparative filter within the range of the above-mentioned expression (1) and investigated the bandpass characteristics thereof. FIG. 3A show bandpass characteristics of a first comparative filter where AP1=1.5AP and AP2=3.0 AP, a second comparative filter where AP1=1.8AP and AP2=2.25AP, and a third comparative filter where AP1=2.0AP and AP2=2.0AP, and the bandpass characteristic of the conventional filter. FIG. 3B is an enlarged view of a portion surrounded by a circle shown in FIG. 3A in which notches take place.

In the comparative examples, notches that increase the insertion loss at about 1,926 MHz. The notch increases as the aperture length AP1 increases. The mostly improved power durability and mostly suppressed non-linearity are available in the third comparative filter where the voltage equal to half the voltage used in the conventional filter is applied between the upper and lower IDTs arranged in the series fragmentation. However, FIGS. 3A and 3B show that the third comparative filter has a large notch. In case where the notch exists in the pass band, different receive sensitivities are available in different channels of, for example, the portable phone. This prevents users from being provided with equal services. In terms of the above consideration, there is no way to use the first comparative filter having the smallest notch.

The notch in the pass band is caused by the electrostatic capacitances between the floating conductors 35a, 35b and 35c. For example, the electrostatic capacitance between the floating conductor 35a of the IDT group 31a and the floating conductor 35b of the IDT group 31b is mainly formed between the electrode finger of the floating conductor 35a closer to (facing) the IDT group 31b and the electrode finger of the floating conductor 35b closer to (facing) the IDT group 31a. According to an aspect of the present invention, there is provided a multimode type SAW filter having multiple IDTs connected in series in which the electrostatic capacitances between the floating conductors can be reduced.

First Embodiment

Figure 4:
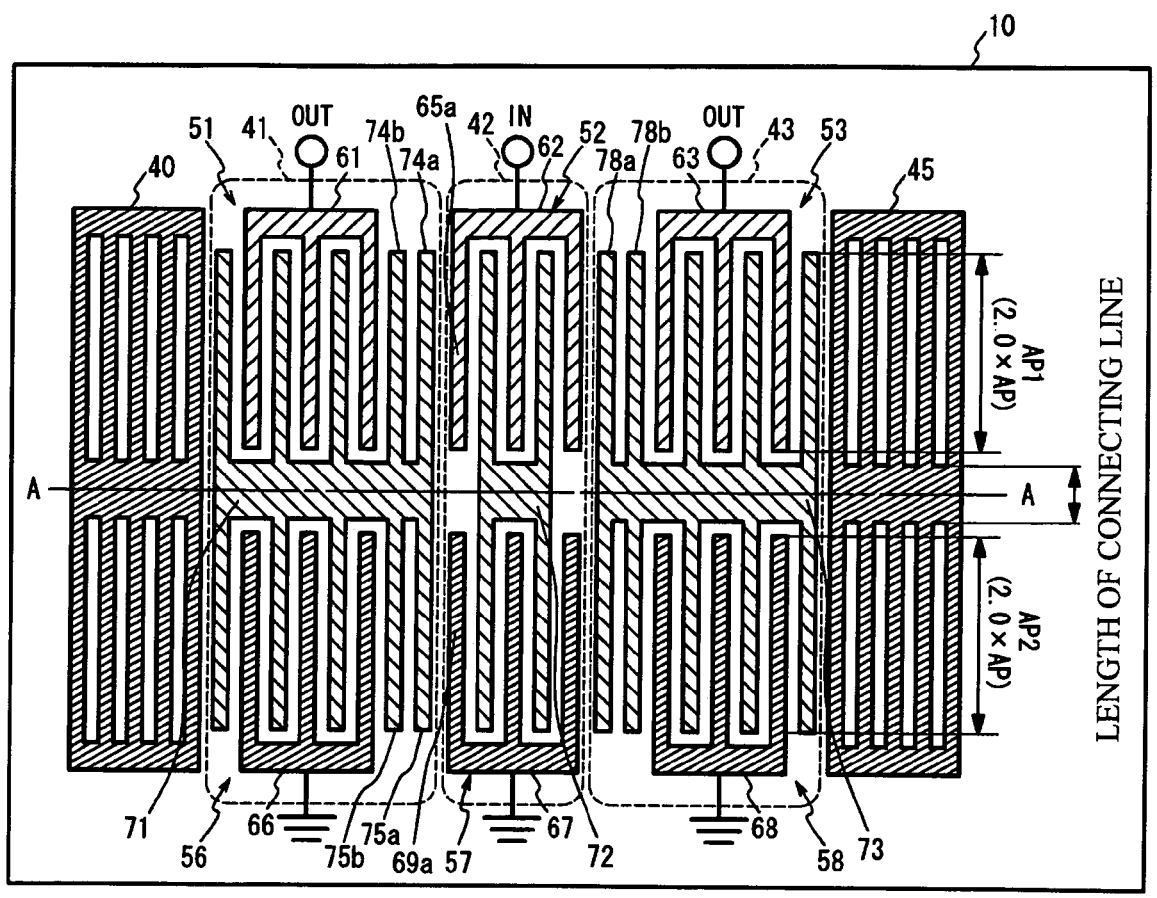
FIG. 4 shows a structure of a first embodiment of the present invention.

FIG. 4 shows a structure of a first embodiment, which is an exemplary double mode type SAW filter that is one of the multimode type SAW filters and has IDT groups in which multiple IDTs are connected in series. Referring to FIG. 4, IDT groups 41, 42 and 43 are arranged in a SAW propagation direction between reflectors 40 and 45 formed on a piezoelectric substrate 10.

The IDT group 41 has IDTs 51 and 56 connected in series. The IDT 51 is composed of an input/output electrode 61 and a floating conductor 71. The IDT 56 is composed of a ground electrode 66 and the floating conductor 71. That is, the IDT 41 is structured so that the IDTs 51 and 56 are connected in series via the floating conductor 71. Similarly, the IDT group 42 has an IDT 52 composed of an input/output electrode 62 and a floating conductor 72, and an IDT 57 composed of a ground electrode 67 and the floating conductor 72. The IDTs 52 and 57 are connected in series via the floating conductor 72. The IDT group 43 has an IDT 53 composed of an input/output electrode 63 and a floating conductor 73, and an IDT 58 composed of a ground electrode 68 and the floating conductor 73. The IDTs 53 and 58 are connected in series via the floating conductor 73. In each of the IDT groups, the input/output electrode and the ground electrode are connected in series via the floating conductor.

The upper IDTs are the IDT 51 (first IDT), the IDT 52 (second IDT), and the IDT 53 (third IDT) arranged in the SAW propagation direction. The lower IDTs are the IDT 56 (first IDT), the IDT 57 (second IDT), and the IDT 58 (third IDT). The input/output electrode 62 of the IDT group 42 is connected to an input terminal, and the input/output electrodes 61 and 63 of the IDT groups 41 and 43 are connected to output terminals. The ground electrodes 66, 67 and 68 are connected to ground terminals. The piezoelectric substrate 10 may be a LiNbO$_3$ substrate or LiTaO$_3$, and the input/output electrodes, ground electrodes and floating conductors may be made of Al.

When an input signal is applied to the input terminal (that is, the IDT group 42), SAWs excited between the reflectors 40 and 45 are propagated towards these reflectors, so that multiple standing waves take place between the reflectors 40 and 45. The voltages that correspond to the frequencies of the standing waves appear between the IDTs 51 and 56 of the IDT group 41 and between the IDTs 53 and 58 of the IDT group 43. Thus, only the desired frequencies that correspond to the standing waves can be output to the output terminals. That is, the DMS in accordance with the first embodiment functions as a bandpass filter.

In the IDT groups 41 and 42, an electrode finger 74a of the floating conductor 71 of the IDT 51 is closest to the IDT 52. An electrode finger 65a of the input/output electrode 62 of the IDT 52 is closet to the IDT 51. An electrode finger 75a of the floating conductor 71 of the IDT 56 is closet to the IDT 57. An electrode finger 69a of the ground electrode 67 of the IDT 57 is closet to the IDT 56. The same relationship as that of the IDTs 51 and 52 is available in the IDT groups 42 and 43.

As mentioned above, in a case where one of the adjacent electrode fingers between the adjacent IDTs is connected to the floating conductor, the other electrode finger is connected to a conductor (input/output electrode or ground electrode) other than the floating conductor. Thus, the electrode finger of the input/output electrode or ground electrode is arranged between the floating conductors 71 and 72, so that the electrostatic capacitance therebetween can be reduced. It is thus possible to restrain the notch in the pass band, as will be described in detail later.

As the connecting lines that connect the electrode fingers of each of the floating conductors 71, 72 and 73 are shorter, the electrostatic capacitances between the floating conductors 71, 72 and 73 become smaller. Preferably, the lengths of the connecting lines are equal to or less than five times the electrode pitch or period of the IDTs.

In the IDT 51 shown in FIG. 4, the floating conductor 71 has an electrode finger 74b in addition to the electrode finger 74a. The electrode finger 74b is adjacent to the electrode finger 74a in the SAW propagation direction. Similarly, in the IDT 56, the floating conductor 71 has an electrode finger 75b in addition to the electrode finger 75a so that the electrode fingers 75a and 75b are adjacent in the SAW propagation direction. That is, one of two kinds of adjacent electrode fingers located between the adjacent IDTs is composed of multiple adjacent electrode fingers that are at an identical potential. In other words, the multiple electrode fingers 74a and 74b at the equal potential are provided between the IDT 51 (first IDT) and the IDT 52 (second IDT), and the multiple electrode fingers 78a and 78b at the equal potential are provided between the IDT 52 (second IDT) and the IDT 53 (third IDT).

In each of all the IDTs that form the multimode type SAW filter, the input/output electrode and the ground electrode are coupled in series via the floating conductor. It is thus possible to improve the power durability and effectively suppress the non-linearity. The electrode fingers 74a and 74b are connected to the conductor 71 at the potential different from the potentials of the input/output electrode 61 and the ground electrode 66, and the electrode fingers 78a and 78b are connected to the conductor 73 at the potential different from the potentials of the input/output electrode 63 and the ground electrode 68. It is thus possible to widen the pass band range.

The IDTs 51 and 52 are adjacent to each other in the SAW propagation direction. The multiple fingers 74a and 74b at the equal potential are connected to the floating conductor 71. Similarly, the multiple electrode fingers 75a and 75b at the equal potential are connected to the floating conductor 71.

The two electrode finger patterns of the IDTs connected in series in each of the IDT groups have a mirror symmetry with respect to an axis that runs in the SAW propagation direction. For example, the IDT 51 and IDT 56 of the IDT group 41 has a mirror symmetry with respect to a line A-A. That is, the input/output electrode 61 and the ground electrode 66 have a mirror symmetry with respect to the line A-A, and the floating conductor 71 has a mirror symmetry with respect to the line A-A.

The input/output electrodes 61 and 63 connected to the output terminals are provided on the upper side of FIG. 4, and the input/output electrode 62 connected to the input terminal is provided on the upper side thereof. The ground electrodes 66, 67 and 68 are provided on the lower side of FIG. 4. That is, the input/output electrodes 61 and 63 connected to the output terminals and the input/output electrode 62 connected to the input terminal are provided in the same direction. It is thus possible to add coupling capacitances between the input terminal and the output terminals and to improve the out-of-band suppression.

The aperture lengths AP1 of the IDTs 51, 52 and 53 and the aperture lengths AP2 of the input IDTs 56, 57 and 58 are equal to 2.0×AP. With this arrangement, the power durability is mostly improved and the non-linearity is mostly suppressed.

Figure 5A:
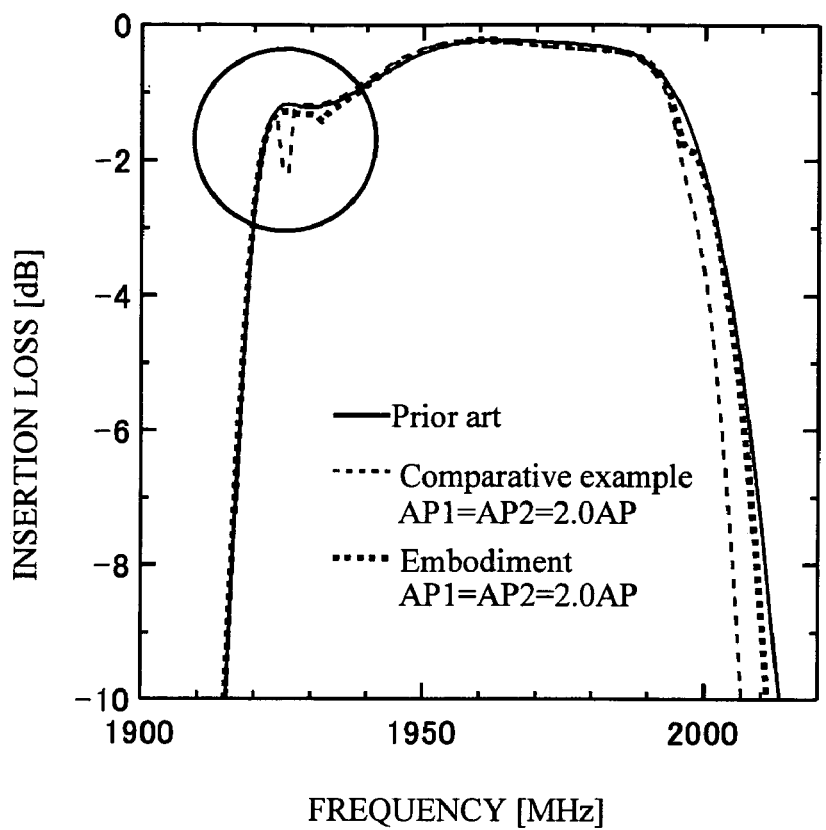
FIG. 5A is a graph of the frequency characteristics of the passbands of the simulated filters.
Figure 5B:
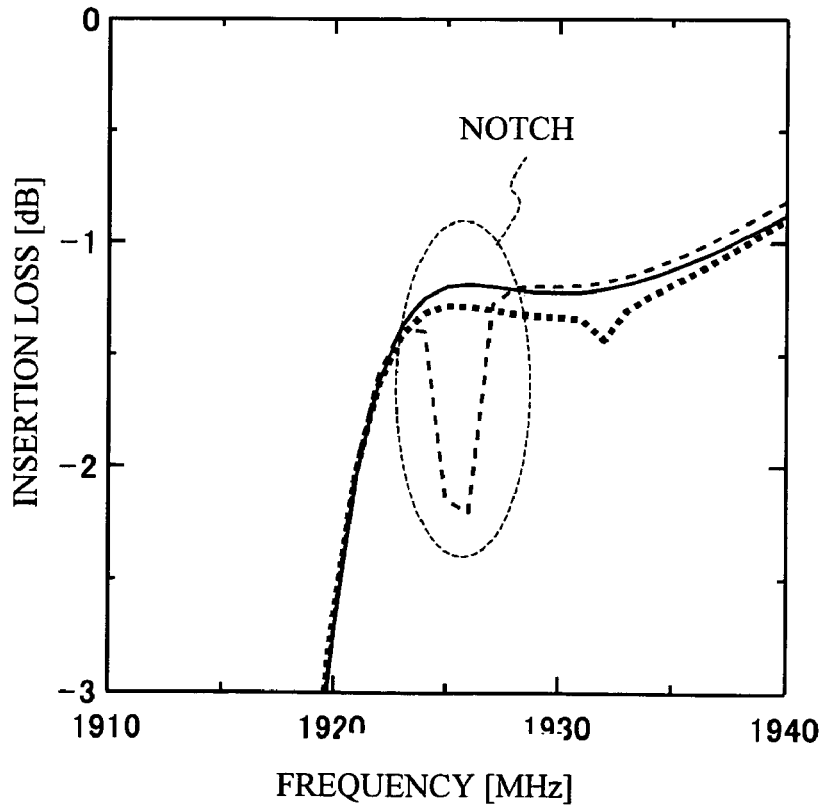
FIG. 5B is an enlarged view of a portion surrounded by a circle shown in FIG. 5A.

The inventors simulated the passband characteristics of the conventional filter shown in FIG. 2A, the comparative filter shown in FIG. 2B where AP1=AP2=2×AP, and the first embodiment shown in FIG. 4 where AP1=AP2=2×AP. The results of the simulation are shown in FIGS. 5A and 5B. FIG. 5A is a graph of the frequency characteristics of the passbands of the simulated filters, and FIG. 5B is an enlarged view of a portion surrounded by a circle shown in FIG. 5A.

As in the case of FIGS. 3A and 3B, a notch that increases the insertion loss takes place at about 1,926 MHz in the comparative filter. In contrast, no notch takes place in the first embodiment. This is because the first embodiment is capable of suppressing the electrostatic capacitance between the floating conductors 71 and 72 and the electrostatic capacitance between the floating conductors 72 and 73. Thus, the multimode type SAW filter having the IDT groups each having multiple IDTs connected in series is allowed to have the relationship AP1=AP2 that results in the mostly improved power durability and the mostly suppressed non-linearity without degrading the filter characteristics. In is thus possible to improve the power durability and the non-linearity without degrading the filter characteristics. Preferably, AP1=AP2 should be satisfied. However, it is not essential to satisfy the relationship AP1=AP2. Even when AP1 is not equal to AP2, the filter characteristics having no notch can be achieved.

The electrostatic capacitance between the floating conductors of the adjacent IDTs may be reduced by not only the first embodiment but also variations thereof. Now, these variations will be described.

Figure 6:
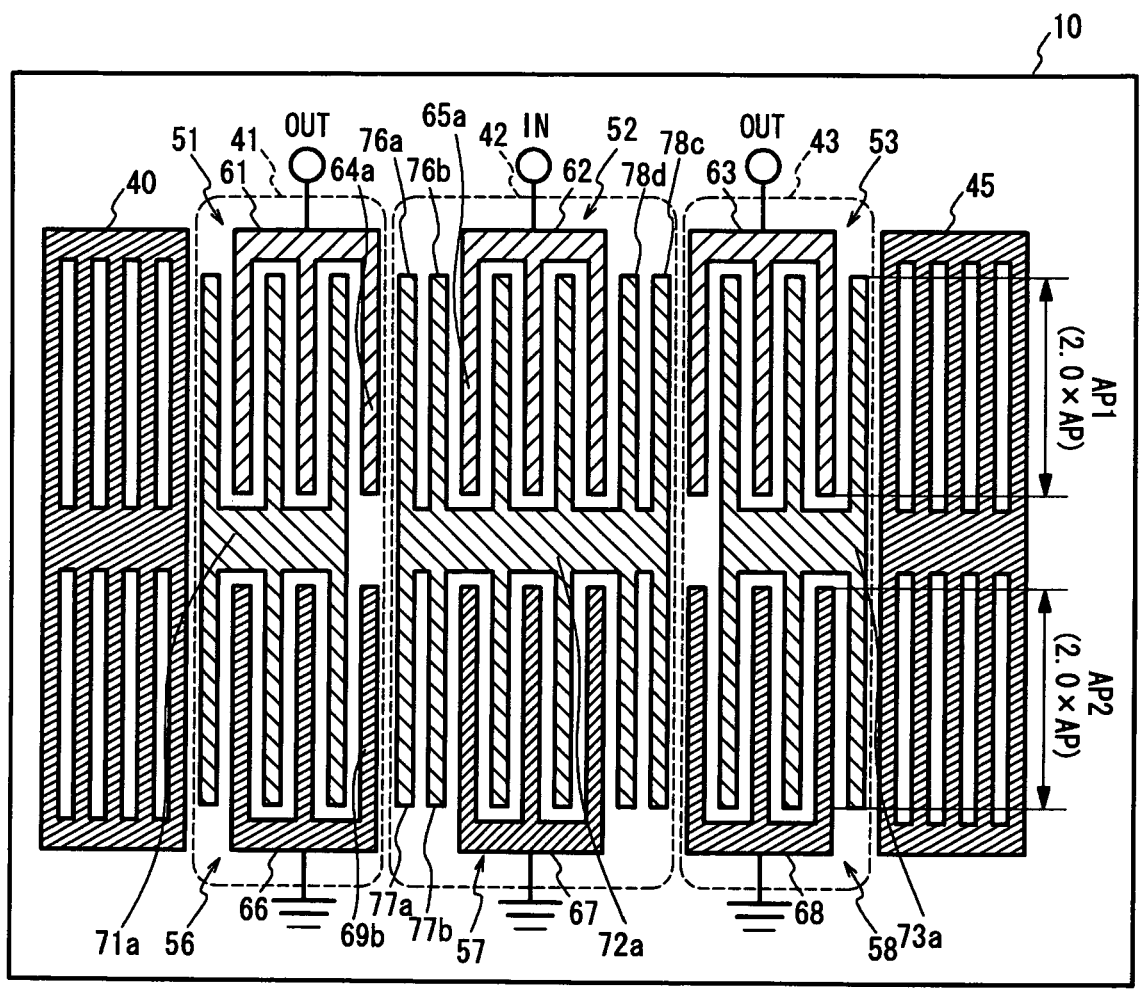
FIG. 6 shows a first variation of the first embodiment.

FIG. 6 shows a first variation of the first embodiment, which differs from the first embodiment in that floating conductors 71a, 72a and 73a are different from the floating conductors 71, 72 and 73. The other structures of the variation are the same as those of the first embodiment. In the adjacent IDTs 51 and 52, the electrode finger of the IDT 51 adjacent to the IDT 52 is an electrode finger 64a of the input/output electrode 61, and the electrode finger of the IDT 52 adjacent to the IDT 51 is an electrode finger 76a of the floating conductor 72a. Similarly, in the adjacent IDTs 56 and 57, the electrode finger of the IDT 56 adjacent to the IDT 57 is an electrode finger 69b of the ground electrode 66, and the electrode finger of the IDT 57 adjacent to the IDT 56 is an electrode finger 77a of the floating conductor 72a. Additionally, an electrode finger 77b is connected to the floating conductor 72a and is arranged close to the electrode finger 77a. The adjacent electrode fingers of the IDT groups 42 and 43 have a relationship similar to the above.

In the above-mentioned manner, the multiple electrode fingers that are at the equal potential may be connected to the floating conductor 72a of the IDT group 42. A mutual connection is made between the multiple electrode fingers 76a and 76b that are at the equal potential and are located between the IDT 51 (first IDT) and the IDT 52 (second IDT), and multiple electrode fingers 78c and 78d that are at the equal potential and are located between the IDT 52 (second IDT) and the IDT 53 (third IDT).

Figure 7:
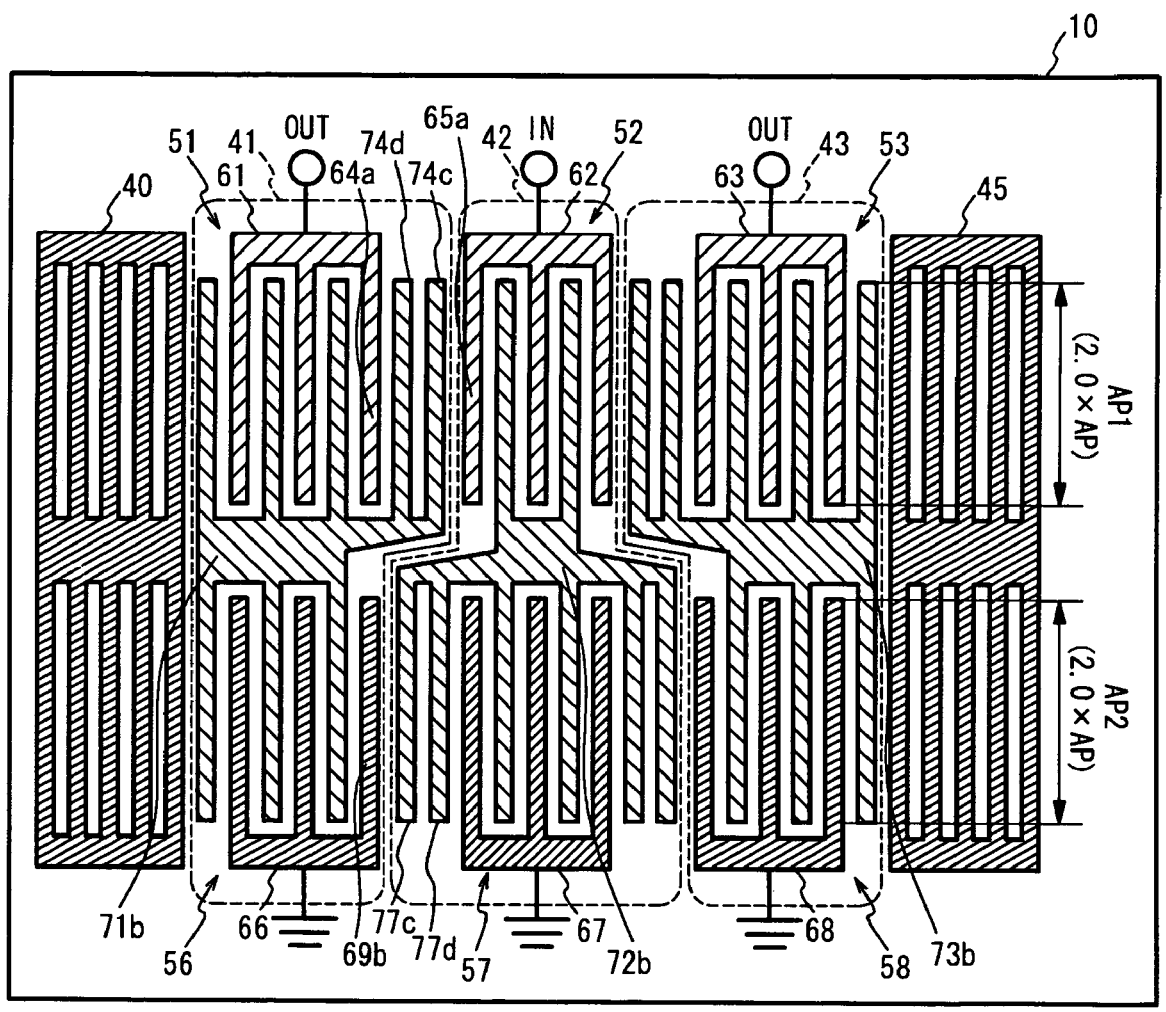
FIG. 7 shows a second variation of the first embodiment.

FIG. 7 shows a second variation of the first embodiment, which differs from the first embodiment in that floating conductors 71b, 72b and 73b have a structure different from that of the first embodiment. In the adjacent IDTs 51 and 52, the electrode finger of the IDT 51 adjacent to the IDT 52 is an electrode finger 74c of the floating conductor 71b, and an electrode finger 74d is additionally provided close to the electrode finger 74c. The electrode finger of the IDT 52 adjacent to the IDT 51 is an electrode finger 65a of the input/output electrode. Similarly, in the adjacent IDTs 56 and 57, the electrode finger of the IDT 56 adjacent to the IDT 57 is an electrode finger 69b of the ground electrode 66, and the electrode finger of the IDT 57 adjacent to the IDT 56 is an electrode finger 77c of the floating conductor 72b, and an electrode finger 77d is additionally provided close to the electrode finger 77c. The adjacent electrode fingers of the IDT groups 42 and 43 have a relationship similar to that mentioned above. As described above, the multiple electrode fingers that are located on the input/output side and are at the equal potentials may be connected to the floating conductors 71b and 73b on the opposite sides, and the multiple electrode fingers that are located on the ground side and are at the equal potential may be connected to the central floating conductor 72b.

Figure 8:
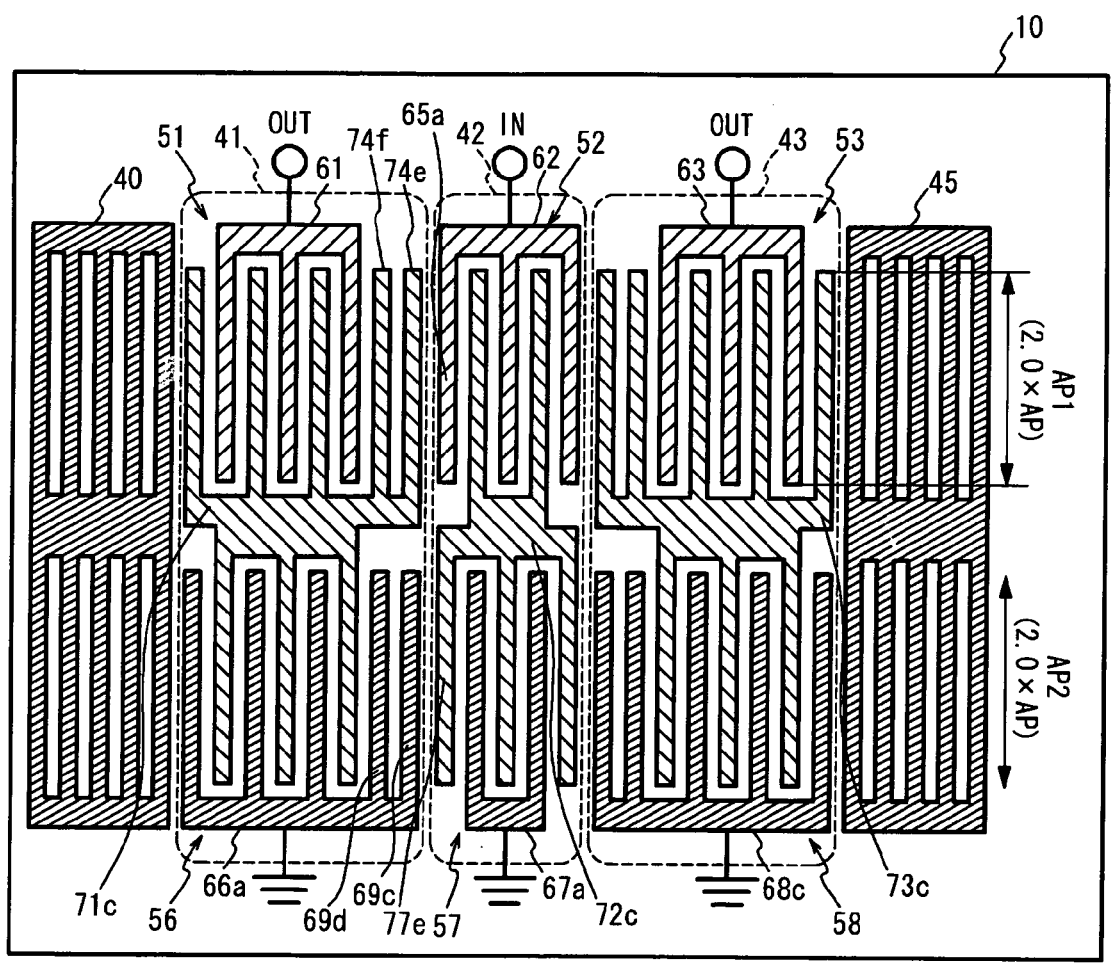
FIG. 8 shows a third variation of the first embodiment.

FIG. 8 shows a third variation of the first embodiment, which has an arrangement in which the electrode finger patterns of the two IDTs among the IDTs connected in series are shifted in parallel in the direction perpendicular to the SAW propagation direction. The IDTs 56, 57 and 58 have electrode patterns obtained by moving the IDTs 51, 52 and 53 in parallel in the direction perpendicular to the SAW propagation direction. That is, a ground electrode 66a has an electrode pattern obtained by moving an upper portion of a floating conductor 71c in parallel, and a lower portion of the floating conductor 71c has an electrode pattern obtained by moving the input/output electrode 61. Similarly, a ground electrode 67a has an electrode pattern obtained by moving an upper portion of a floating conductor 72c, and a lower portion of the floating conductor 72c has an electrode pattern obtained by moving the input/output electrode 62 in parallel. A ground electrode 68c has an electrode pattern obtained by moving an upper portion of a floating conductor 73c in parallel, and a lower portion of the floating conductor 73c has an electrode pattern obtained by moving the input/output electrode 63 in parallel.

With the above arrangement, in the adjacent IDTs 51 and 52, the electrode finger of the IDT 51 adjacent to the IDT 52 is an electrode finger 74e of the floating conductor 71c, and an electrode finger 74f is additionally provided close to the electrode finger 74e. The electrode finger of the IDT 52 adjacent to the IDT 51 is an electrode finger 65a of the input/output electrode 52. Similarly, in the adjacent IDTs 56 and 57, the electrode finger of the IDT 56 close to the IDT 57 is an electrode finger 69c of the ground electrode 66a, and the electrode finger of the IDT 57 close to the IDT 56 is an electrode finger 77e of the floating conductor 72c. As in the case of the IDT 56, the multiple electrode fingers 69c and 69d at the equal potential are connected to the ground electrode 66a. This shows that the multiple electrode fingers at the identical potential may be connected to a conductor other than the floating conductor as long as the conductor is at the same potential as the multiple electrode fingers.

Figure 9:
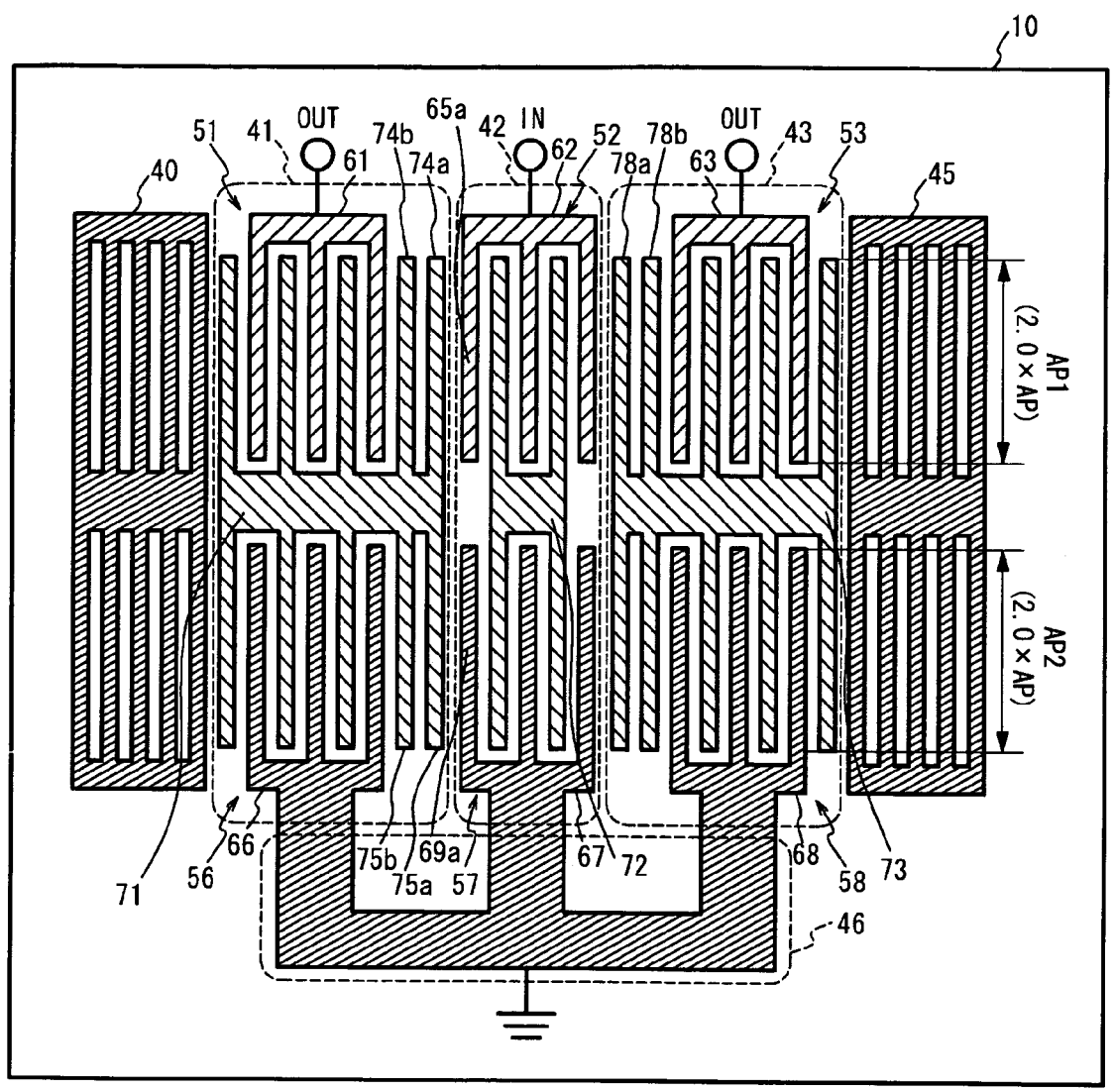
FIG. 9 shows a fourth variation of the first embodiment.

FIG. 9 shows a fourth variation of the first embodiment. The fourth variation has an arrangement in which the ground electrodes 66, 67 and 68 are connected on the piezoelectric substrate 10 via a connecting line 46. The other structures of the fourth variation are the same as those of the first embodiment. It should be noted that the ground electrodes of the IDTs are connected together on the piezoelectric substrate. This makes it easy to control the common ground inductance added to the IDT group 42 connected to the input terminal and the IDT groups 41 and 43 connected to the output terminals.

Figure 10:
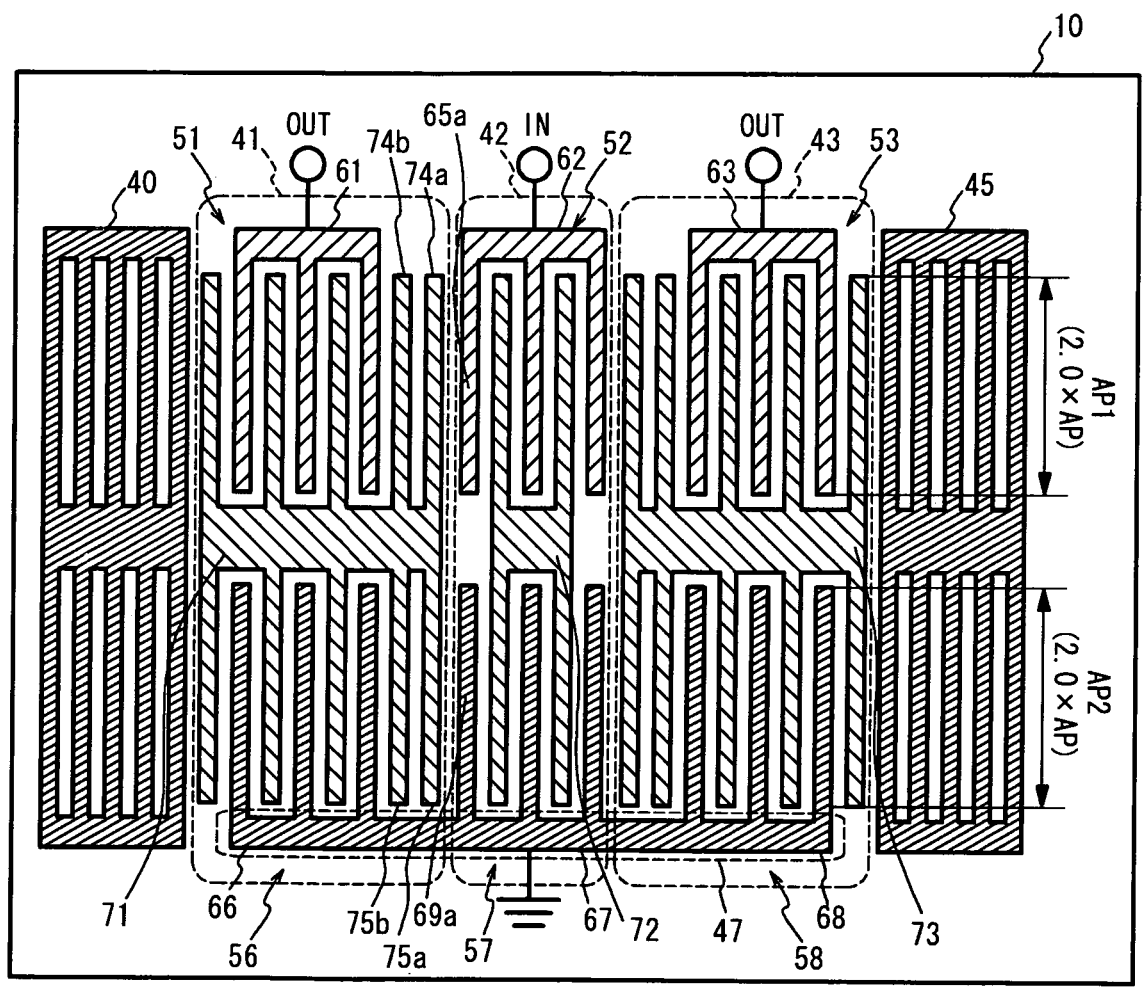
FIG. 10 shows a fifth variation of the first embodiment.

FIG. 10 shows a fifth variation of the first embodiment. The ground electrodes 66, 67 and 68 are unified, and the electrode fingers of the ground electrodes 66, 67 and 68 are directly connected to a single ground bus bar 47. The ground bus bar 47 is a straight line shaped electrode to which the electrode fingers are directly connected. All the electrode fingers of the ground electrodes of the IDTs 56, 57 and 58 are connected to the single bus bar, and the other structures of the fifth variation are the same as those of the first embodiment. It is thus possible to make it easy to control the common ground inductance added to the IDT group 42 connected to the input terminal and the IDTs 41 and 43 connected to the output terminals.

Figure 11:
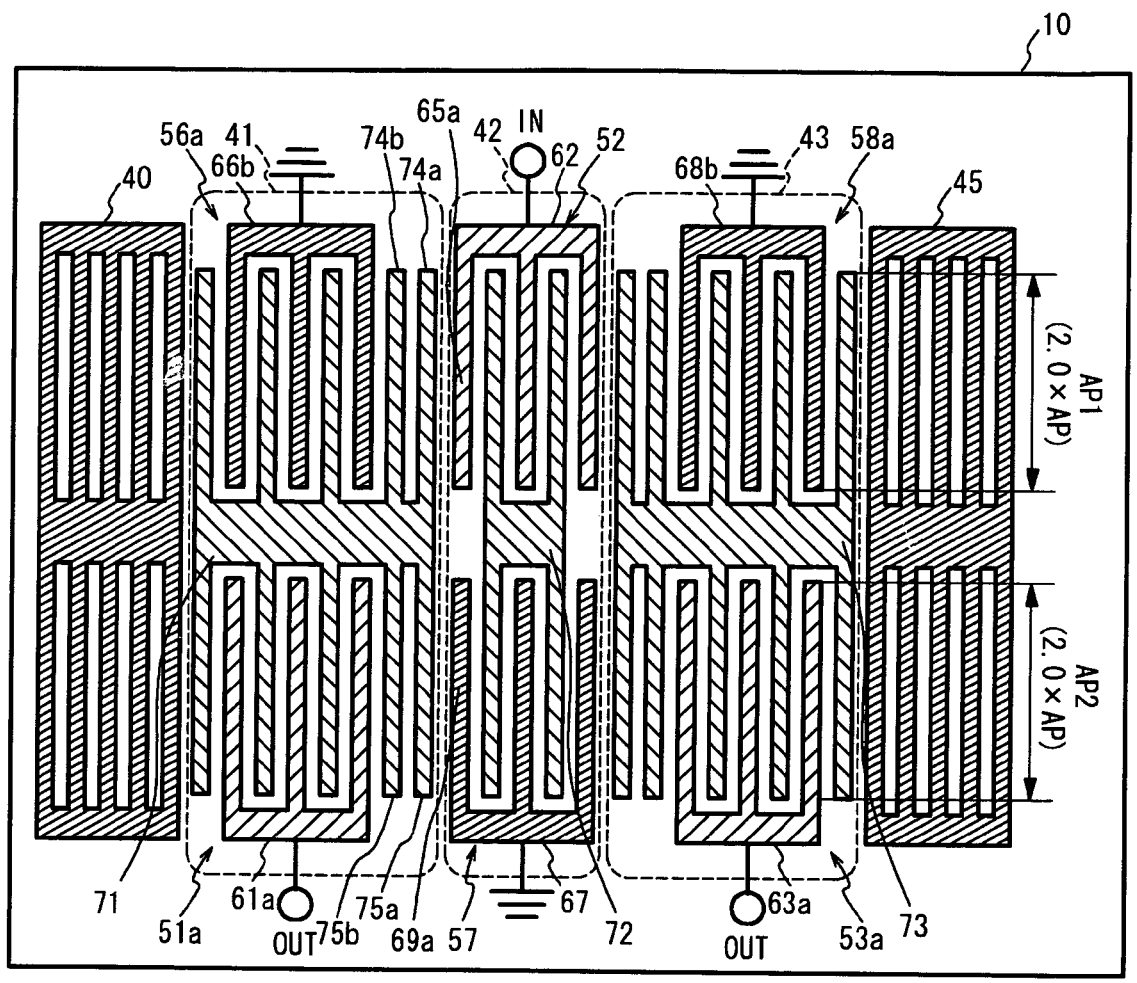
FIG. 11 shows a sixth variation of the first embodiment.

FIG. 11 shows a sixth variation of the first embodiment, in which input/output electrodes 61a and 63a connected to the output terminals are provided in a different direction from that in which an input/output electrode 62 connected to the input terminal is provided. The IDT group 42 has a lower stage of the IDT 57 having the ground electrode 67 and the floating conductor 72, and an upper stage of the IDT 52 having the input/output electrode connected to the input terminal and the floating conductor 72. In contrast, the IDT groups 41 and 43 have lower stages of IDTs 51a and 53a having input/output electrodes 61a and 63a connected to the output terminals and the floating conductors 71 and 73, and upper stages of IDTs 56a and 58a having ground electrodes 66b and 68b, and the floating conductors 71 and 73, respectively. The other structures of the sixth embodiment are the same as those of the first embodiment. With the above arrangement, it is possible to improve the power durability and suppress the non-linearity.

Figure 12:
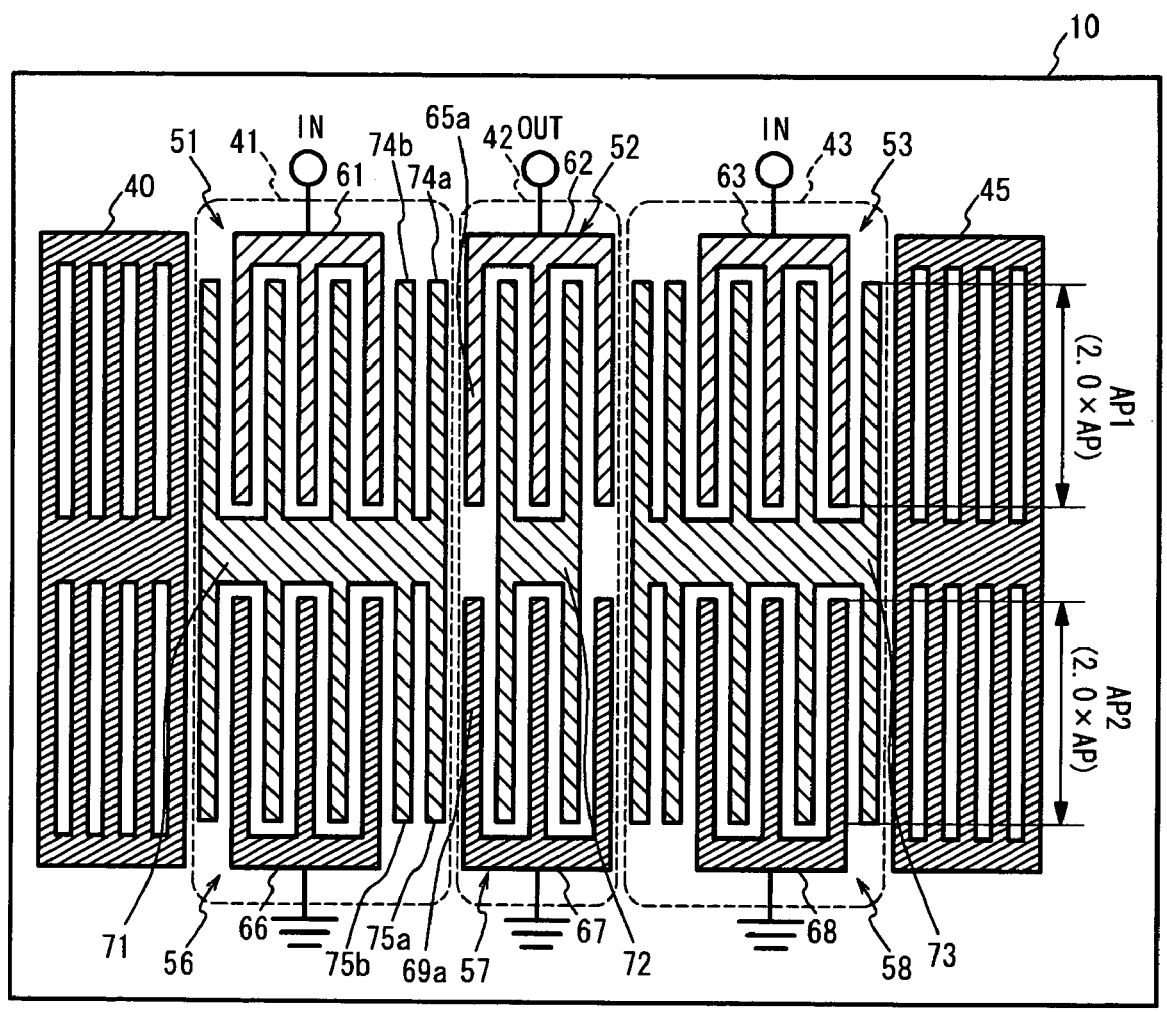
FIG. 12 shows a seventh variation of the first embodiment.

FIG. 12 shows a seventh variation of the first embodiment. As to the IDT groups 41 and 43 located on the opposite sides, the input/output electrode 61 of the IDT 51 and the input/output electrode 63 of the IDT 53 are connected to input terminals, and the input/output terminal 62 of the IDT 52 of the IDT group 42 is connected to the output terminal. The other structures of the seventh variation are the same as those of the first embodiment. As compared to the first embodiment, the seventh variation has more improved durability and more suppressed non-linearity.

Figure 13:
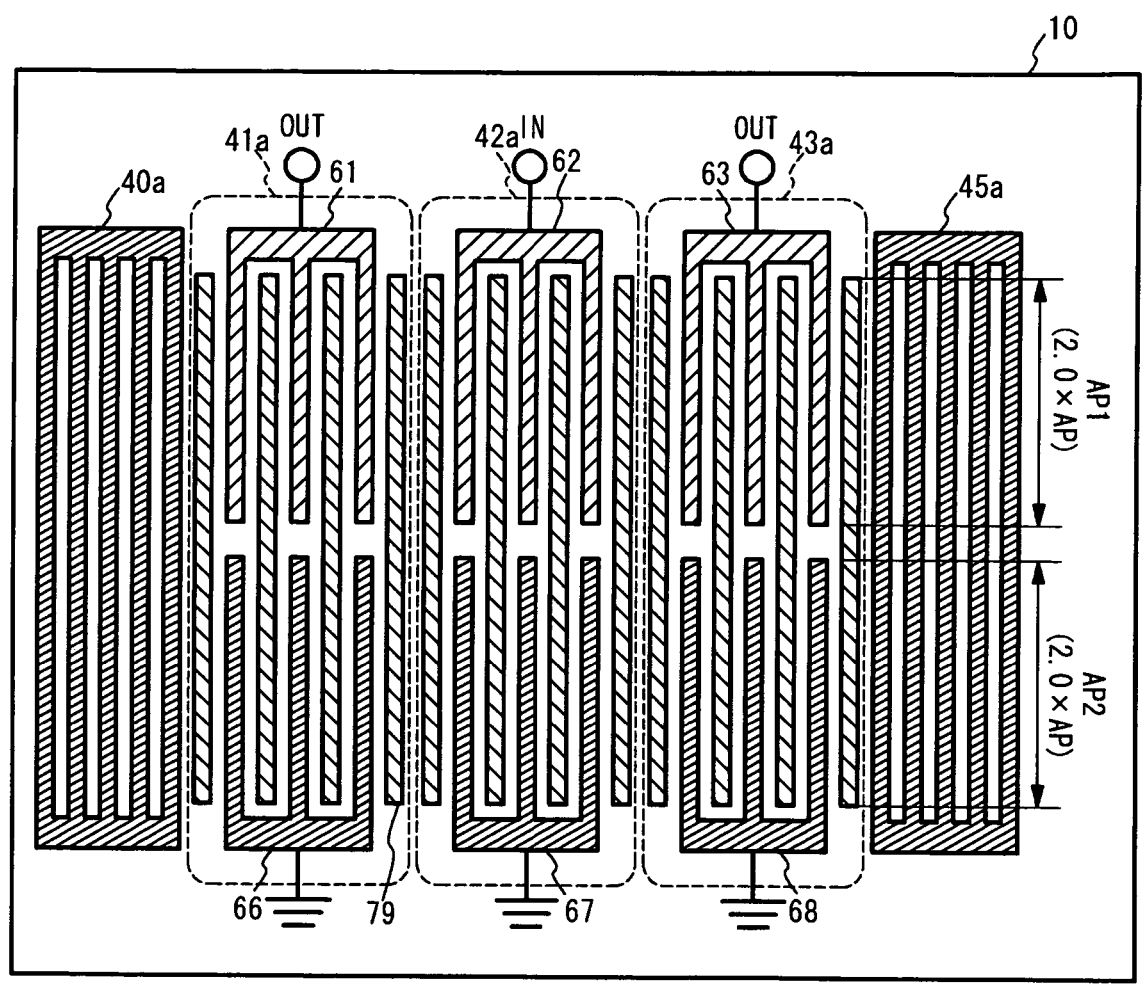
FIG. 13 shows an eighth variation of the first embodiment.

FIG. 13 shows an eighth variation of the first embodiment, in which the connecting lines of the floating conductors are eliminated. IDT groups 41a, 42a and 43a are disposed between reflectors 40a and 45a in the SAW propagation direction. The IDT group 41a has the input/output electrode 61 and the ground electrode 66, and electrode fingers 79 of the floating conductor are interposed between the electrode fingers of the electrodes 61 and 66. Similarly, the IDT group 42a has the input/output electrode 62 and the ground electrode 69, and electrode fingers 79 of the floating conductors are interposed between the electrode fingers of the electrodes 62 and 67. The IDT group 43a has the input/output electrode 63 and the ground electrode 68, and electrode fingers 79 of the floating conductor are interposed between the electrode fingers of the electrodes 63 and 68. Further, two electrode fingers 79 serving as floating conductors are provided so as to run between the input/output electrodes 61 and 62 and the ground electrodes 66 and 67. Similarly, two electrode fingers 79 serving as floating conductors are provided so as to run between the input/output electrodes 62 and 63 and between the ground electrodes 67 and 68. The other structures of the eighth embodiment are the same as those of the first embodiment. The elimination of the connecting lines of the floating conductors further suppresses the notch in the pass band.

Figure 14:
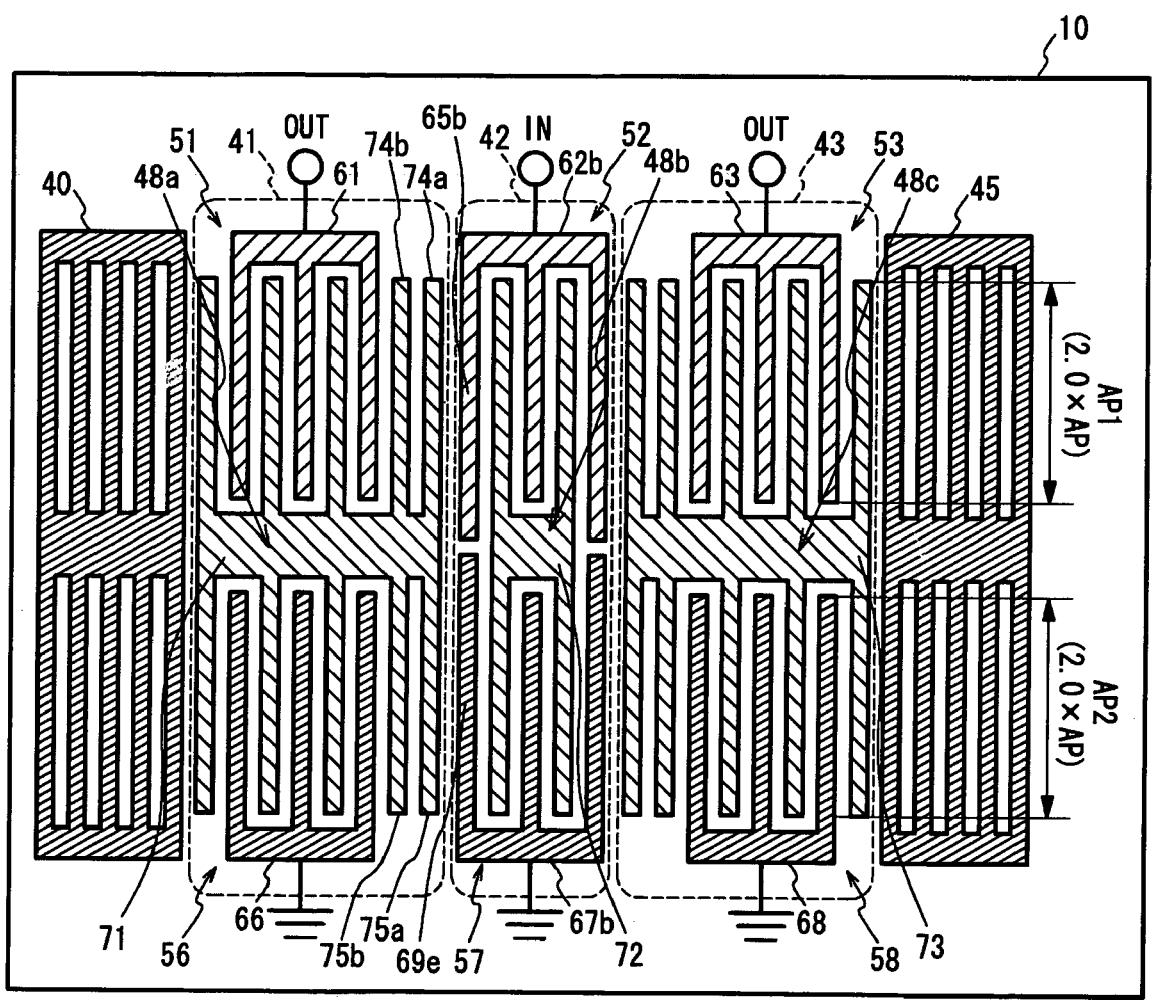
FIG. 14 shows a ninth variation of the first embodiment.

FIG. 14 shows a ninth embodiment of the first embodiment, in which there is provided an electrode finger between the connecting lines of the adjacent floating conductors of the adjacent IDTs, the electrode finger being not connected to the above connecting lines. The other structures of the ninth embodiment are the same as those of the first embodiment. Electrode fingers 65b and 69e are provided between the connecting line 48a of the floating conductor 71 of the IDTs 51 and 56 and the connecting line 48b of the floating conductor 72 of the IDTs 52 and 57. Further, the electrode finger 65b is connected to the input/output electrode 62b, and the electrode finger 69e is connected to the ground electrode 67b. That is, the electrode fingers 65b and 69e are not connected to the floating conductors 71 and 72 but are isolated therefrom. The connecting lines 48b and 48c of the IDT groups 42 and 43 have the same relation as mentioned above. That is, the electrode fingers are provided between the connecting lines of the adjacent floating conductors of the two adjacent IDTs connected in series, these electrode fingers being not connected to the above connecting lines. It is thus possible to reduce the electrostatic capacitances between the connecting lines 48a and 48b and between the connecting lines 48b and 48c. More specifically, it is possible to reduce the electrostatic capacitance between the floating conductors 71 and 72 and that between the floating conductors 72 and 73. Therefore, the notch in the pass band can be further suppressed.

The first embodiments and variations thereof are the exemplary DMS filters. However, the present invention is not limited to the DMS filters but may include multimode SAW filters such that multiple IDT groups are arranged in the SAW propagation direction. Even the multimode SAW filters have similar advantages to the above. The number of electrode fingers at the equal potential is not limited to two, but an arbitrary number of electrode fingers more than two may be used to obtain the similar advantages.

Second Embodiment

Figure 15:
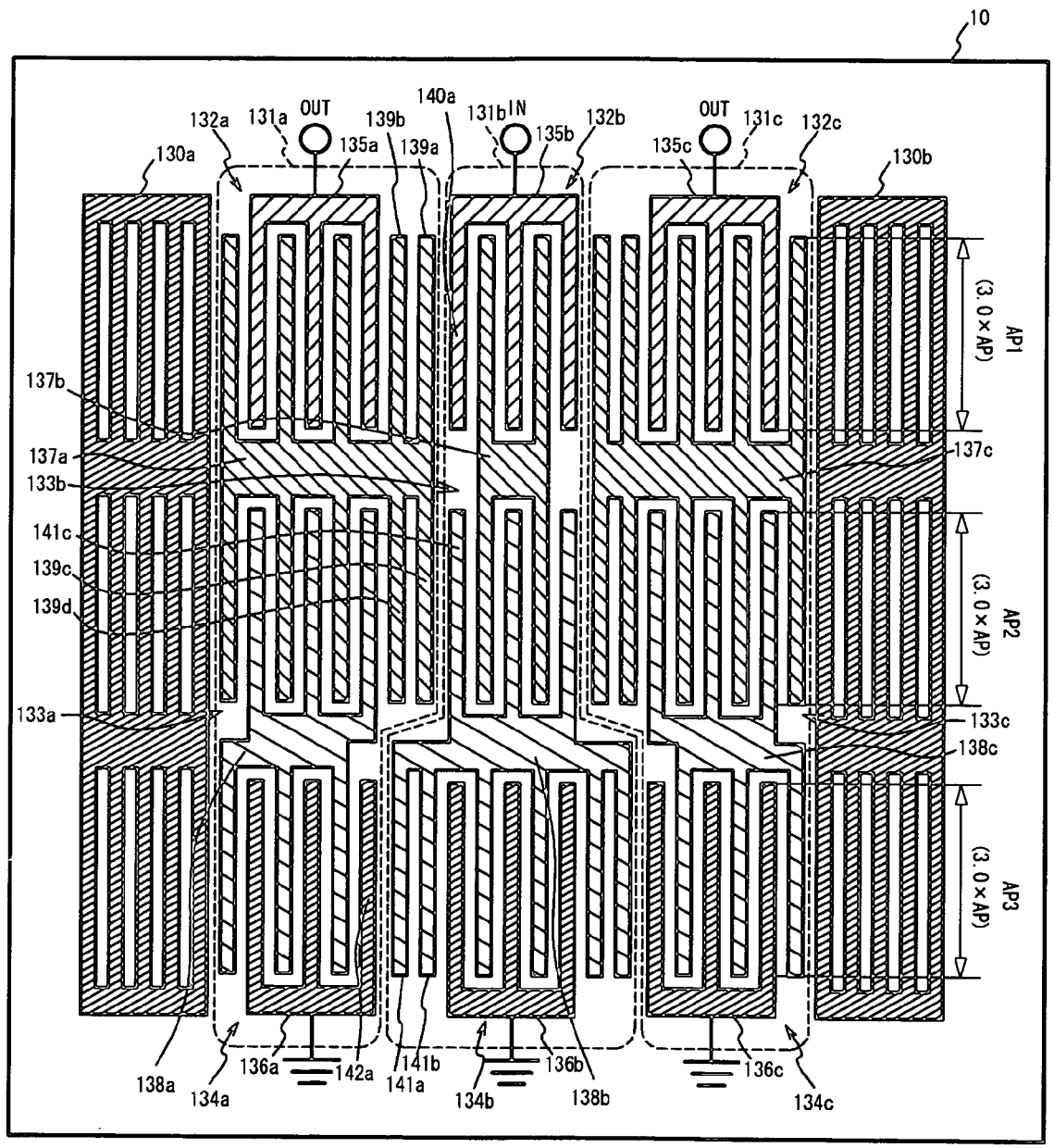
FIG. 15 shows a second embodiment of the present invention.

A second embodiment of the present invention is an exemplary filter having three IDTs connected in series. FIG. 15 is a top view of the second embodiment. Three IDT groups 131a, 131b and 131c are provided on the piezoelectric substrate 10 and are located between reflectors 130a and 130b also provided thereon. The IDT group 131a has IDTs 132a, 133a and 134a connected in series. The IDT 132a has an input/output electrode 135a and a floating conductor 137a. The IDT 133a has the floating conductor 137a and another floating conductor 138a. The IDT 134a has a ground electrode 136a and the floating conductor 138a. Similarly, the IDT group 131b has IDTs 132b, 133b and 134b connected in series. The IDT 132b has an input/output electrode 135b and a floating conductor 137b. The IDT 134b has the floating conductor 137b and another floating conductor 138b. The IDT 134b has a ground electrode 136b and the floating conductor 138b. The IDT group 131c has IDTs 132c, 133c and 134c connected in series. The IDT 132c has an input/output electrode 135c and a floating conductor 137c. The IDT 134c has the floating conductor 137c and another floating conductor 138c. The IDT 134c has a ground electrode 136c and the floating conductor 138c.

In the adjacent IDTs 132a and 132b, the electrode finger of the IDT 132a adjacent to the IDT 132b is an electrode finger 139a of a floating conductor 137a. The electrode finger of the IDT 132b adjacent to the IDT 132a is an electrode finger 140a of an input/output electrode 135b. Similarly, in the adjacent IDTs 133a and 133b, the electrode finger of the IDT 133a adjacent to the IDT 133b is an electrode finger 139c of a floating electrode 137a. The electrode finger of the IDT 133b adjacent to the IDT 133a is an electrode finger 141c of a floating conductor 138b. In the adjacent IDTs 134a and 134b, the electrode finger of the IDT 134a adjacent to the IDT 134b is an electrode finger 142a of a ground electrode 136a. The electrode finger of the IDT 134b adjacent to the IDT 134a is an electrode finger 141a of a floating conductor 138b. The IDT groups 131b and 131c have a relationship similar to the above.

The IDTs 133a, 133b and 133c at the middle stage have a mirror relationship with the IDTs 132a, 132b and 132c at the upper stage with respect to an axis running in the SAW propagation direction. The IDTs 134a, 134b and 134c at the lower stage have an electrode pattern obtained by moving the IDTs 33a, 133b and 133c at the middle stage in parallel in the direction perpendicular to the SAW propagation direction.

As described above, one of the adjacent electrode fingers between the adjacent IDTs is connected to the floating conductor, the other electrode finger is connected to a conductor other than the above floating conductor, such as the input/output electrode or ground electrode. The electrode finger 140a of the input/output electrode 135b is disposed between the adjacent floating conductors 137a and 137b, and the electrode finger 142a of the ground electrode 136a is disposed between the adjacent floating conductors 138a and 138b. It is thus possible to reduce the electrostatic capacitance between the floating conductors 137a and 137b and the electrostatic capacitance between the floating conductors 138a and 138b and to suppress the notch in the pass band, as in the case of the first embodiment.

An electrode finger 139b of the floating conductor 137a of the IDT 132a is additionally provided close to the electrode finger 139a thereof. The electrode fingers 139a and 139b are the adjacent electrode fingers for the IDT 132b. Similarly, the adjacent electrode fingers of the IDT 133a adjacent to the IDT 133b includes an electrode finger 139d of the floating conductor 137a in addition to the electrode finger 139c thereof so that the electrode fingers 139c and 139d are arranged side by side and are adjacent to each other. The adjacent electrode fingers of the IDT 134b adjacent to the IDT 134a includes an electrode finger 141b of the floating conductor 138b in addition to the electrode finger 141a thereof so that the electrode fingers 141a and 141b are arranged side by side and are adjacent to each other one of two kinds of adjacent electrode fingers located between the adjacent IDTs is composed of multiple adjacent electrode fingers that are at an identical potential.

Preferably, the second embodiment having three divided IDTs connected in series has the same impedance as the conventional filter shown in FIG. 2A. It is thus preferred that the composite electrostatic capacitances of the IDT groups 131a, 131b and 131c are respectively equal to the electrostatic capacitances of the IDTs 21a and 22b and 23c. It is therefore preferable to satisfy the following equation:

$$AP1 \times AP2 \times AP3 = (AP1 \times AP2 + AP1 \times AP3 + AP2 \times AP3) \times AP$$

where AP1 is the aperture lengths of the IDTs 132a, 132b and 132c of the upper stage, AP2 is the aperture lengths of the IDTs 133a, 133b and 133c of the middle stage, and AP3 is the aperture lengths of the IDTs 134a, 134b and 134c of the lower stage. When AP1=AP2=AP3=3.0AP, the voltage applied across each IDT is the lowest. It is thus possible to obtain the mostly improved power durability and the mostly suppressed non-linearity. The second embodiment assumes that AP1=AP2=AP3=3.0AP.

In the second embodiment having the relationship of AP1=AP2=AP3=3.0AP, the voltage applied across each IDT is equal to ⅓ of the voltage applied across each IDT of the conventional filter. The voltage in the first embodiment is equal to ½ of the conventional voltage. Therefore, the second embodiment has further improved power durability and further suppressed non-linearity. As the number of stages resulting from the series fragmentation increases, the power durability can be further improved and the non-linearity can be further suppressed. However, the filter area increases. The number of stages by the series fragmentation may be determined taking into account the chip area of the filter, the power durability and non-linearity.

Third Embodiment

Figure 16:
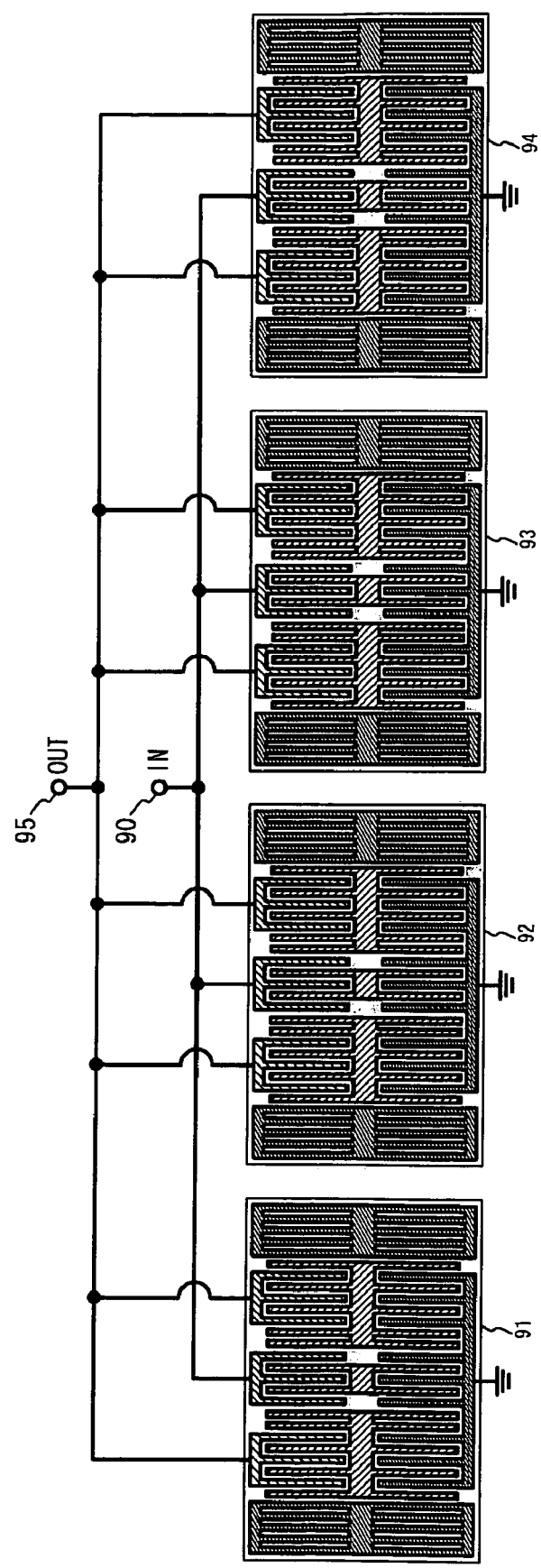
FIG. 16 shows a third embodiment of the present invention.

A third embodiment has four multimode SAW filters that are configured in accordance with the first embodiment and are connected in parallel. FIG. 16 shows the third embodiment. The filter shown in FIG. 16 has four DMS filters 91, 92, 93 and 94, each of which has the same configuration as the fifth variation of the first embodiment. The aperture length of the third embodiment is equal to ¼ of that of the fifth variation. The input terminals of the DMS filters 91, 92, 93 and 94 are connected in parallel, and are connected to a common input terminal 90. The output terminals of the DMS filters 91 through 94 are connected in parallel, and are connected to a common output terminal 95. The third embodiment with the four DMS filters connected in parallel will have an input/output impedance equal to that of the fifth variation of the first embodiment if the aperture length of each of the DMS filters 91-94 is equal to ¼ of that of the fifth variation of the first embodiment. The ¼ reduced aperture length reduces the resistances of the electrode fingers and the insertion loss.

The DMS filters 91-94 used in the third embodiment are not limited to the fifth variation of the first embodiment but may have another configuration. The number of the DMS filters used in the third embodiment is not limited to four but an arbitrary number of DMS filters may be employed. As an increased number of DMS filters connected in parallel, a reduced aperture length can be used and a lowered insertion loss is available. However, the filter size becomes larger. The number of DMS filters to be connected in parallel may be selected taking into account the filter size and insertion loss.

Fourth Embodiment

Figure 17:
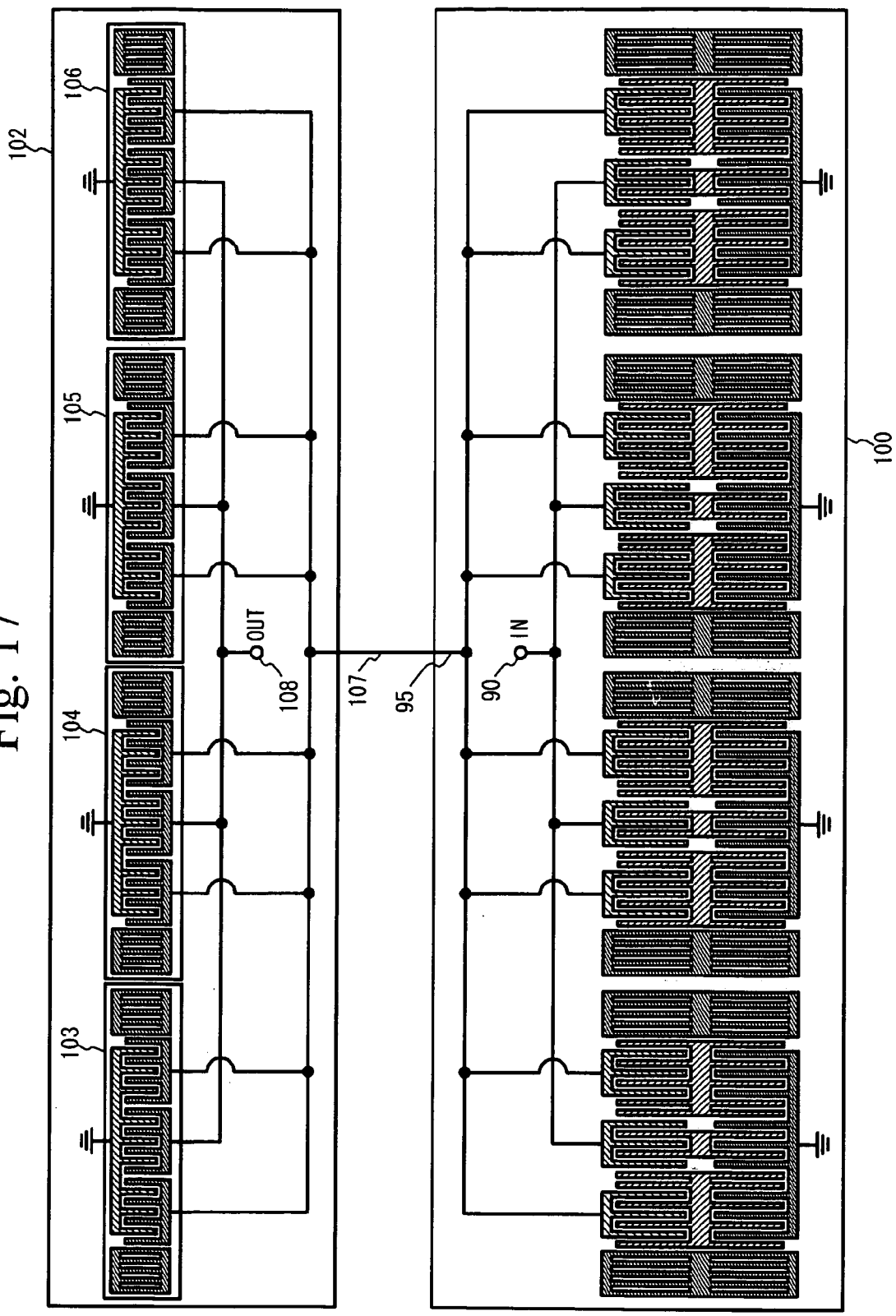
FIG. 17 shows a fourth embodiment of the present invention.

A fourth embodiment is configured by connecting a multimode type SAW filter having only IDTs that are not formed by the series fragmentation to the output terminal of the multimode type SAW filter configured in accordance with the third embodiment. FIG. 17 shows the fourth embodiment, which has a first filter 100 of the third embodiment, and a second filter 102 having an input terminal 107 connected to the output terminal 95 of the first filter 100. The first filter 100 is the multimode type SAW filter of the third embodiment, and the second filter 102 is composed of conventional DMS filters 103, 104, 105 and 106 connected in parallel and having no series fragmentation. The input terminals of the DMS filters 103, 104, 105 and 106 are connected to a common input terminal 107 of the second filter 102, and output terminals of the DMS filters 103, 104, 105 and 106 are connected to a common output terminal 108 of the second filter 102.

The first and second filters 100 and 102 are cascaded, so that the out-of-band suppression can be greatly improved. The first filter 100 connected to the input terminal 90 mainly affects the power durability and non-linearity. The first filter 100 formed by the third embodiment improves the power durability and suppresses the non-linearity. The second filter 102 has only the IDTs that are not subjected to the series fragmentation, and occupies a small area on the piezoelectric substrate.

As described above, preferably the second filter 102 has only the IDTS that are not subjected to the series fragmentation. Alternatively, the second filter 102 may have IDTs formed by the fragmentation such as the third embodiment. The first filter 100 may be the first embodiment or any of the variations thereof. The second filter 102 may be a multimode type SAW filter composed of one or multimode type SAW filters connected in parallel.

Fifth Embodiment

Figure 18:
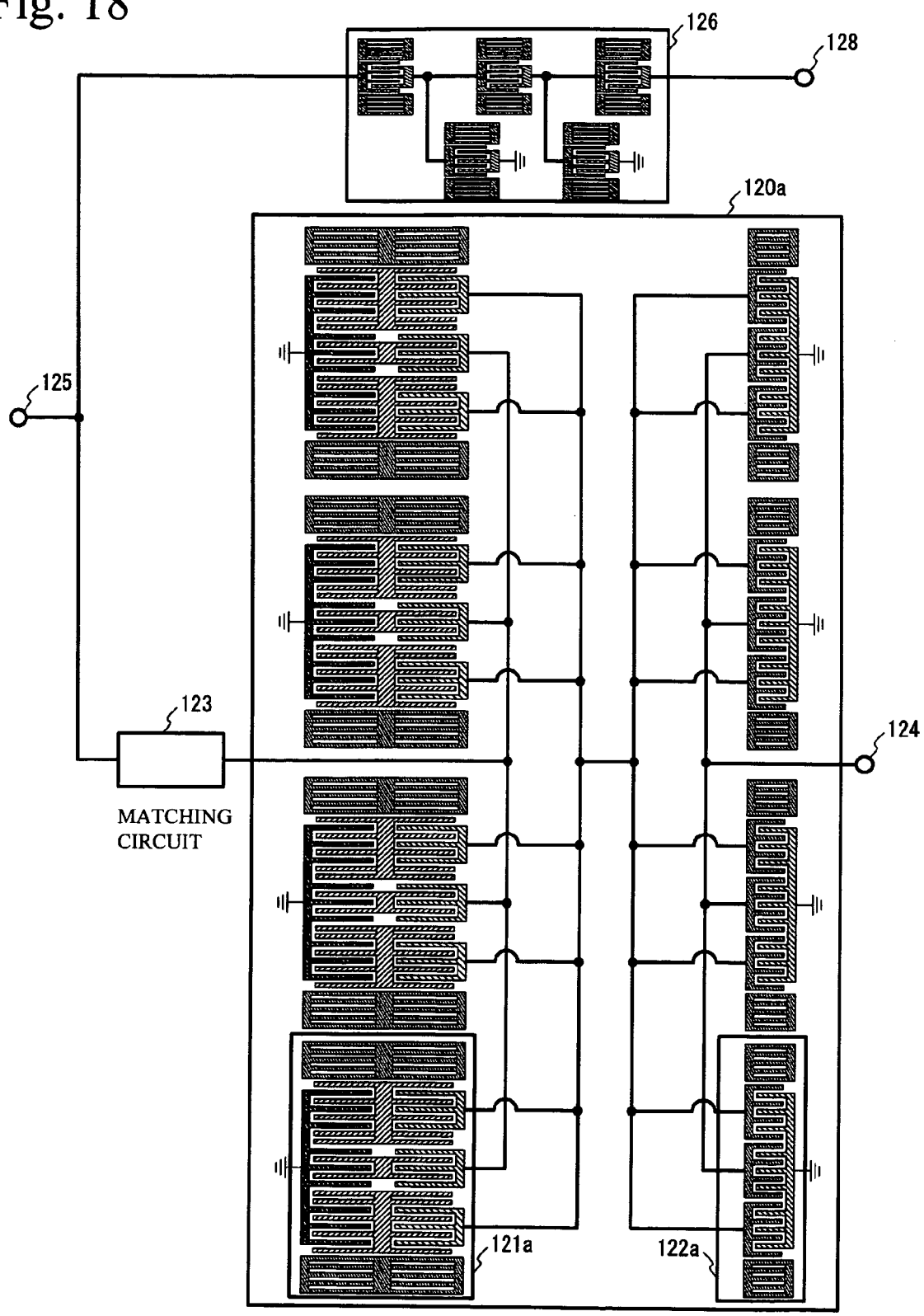
FIG. 18 shows an antenna duplexer in accordance with a fifth embodiment of the present invention.

A fifth embodiment is an antenna duplexer for the portable phone to which the filter of the fourth embodiment is applied. FIG. 18 shows the antenna duplexer of the fifth embodiment. The antenna duplexer has a receive filter 120a formed by the fourth embodiment, and four DMS filters 121a formed by the fifth variation of the first embodiment are connected in parallel and are connected to the input filter of the receive filter 120a. Further, the receive filter 120a includes four conventional DMS filters 122a connected to the common output terminal of the four DMS filters 121a.

A transmit terminal 128 is connected to an input terminal of a transmit filter 126 formed by a ladder type SAW filter, which has an output terminal connected to an antenna terminal 125. A transmit signal applied to the antenna terminal 128 is applied to the transmit filter 126, which allows only desired frequency components to pass therethrough. These frequency components are transmitted via the antenna terminal 125 to which an antenna is connected. The antenna terminal 125 is coupled to a matching circuit 123, which is connected to the input terminal of the receive filter 120a. The output terminal of the receive filter 120a is connected to the receive terminal 124. A receive signal received via the antenna terminal 125 passes through the matching circuit 123, and only desired frequency components thereof are allowed to pass through the receive filter 120a, and are applied to the receive terminal 124.

The transmit filter 126 is formed by the ladder type SAW filter having high power durability, and is thus capable of withstanding transmit signals of high power. The receive filter 120a is formed by the multimode type SAW filter of the present invention, whereby a high out-of-band attenuation and a steep cutoff characteristic can be obtained. Further, as has been described with reference to FIG. 1, even in a case where part of the transmit signal from the transmit filter 126 leaks to the receive filter 120a, the receive filter 120a has improved power durability and is hardly broken by the leakage power. Furthermore, the receive filter 120a has suppressed non-linearity and an improved receive sensitivity.

The inventors performed a cross modulation test (CM test), which is one of factors used for evaluating the performance of the antenna duplexer in order to confirm the effects of suppression of non-linearity.

Figure 1:
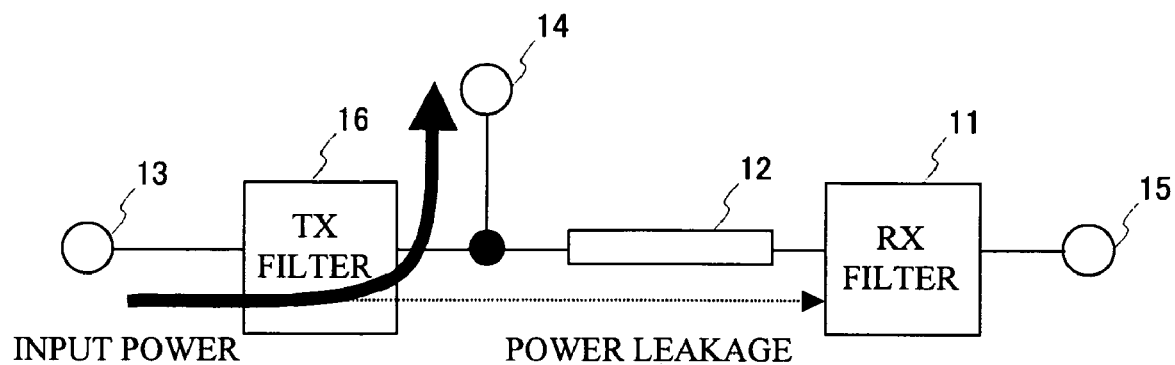
FIG. 1 a block diagram of a conventional antenna duplexer used in a portable phone.
Figure 19A:
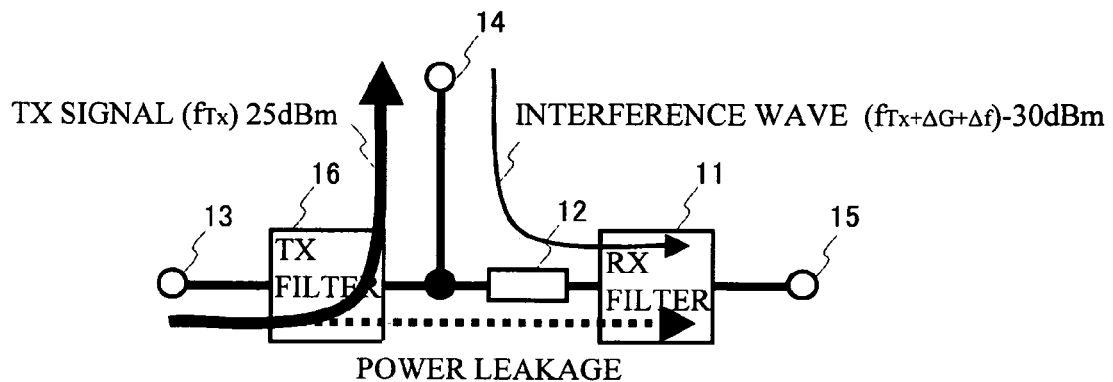
FIG. 19A shows an environment of a cross modulation test.

FIG. 19A shows an environment of the CM test. The block structure of the antenna duplexer is the same as shown in FIG. 1. A modulated signal (transmit signal) having a large power and a transmit frequency $f_{Tx}$ is applied to the transmit terminal 13 in order to obtain a power of 25 dBm at the antenna terminal 14. Simultaneously, the antenna terminal 14 is provided with a non-modulated signal (interference wave) that is as weak as −30 dBm and has a receive frequency of $f_{Tx}+\Delta G+\Delta f$. Then, the signal spectra available at the receive terminal 15 was measured.

Figure 19B:
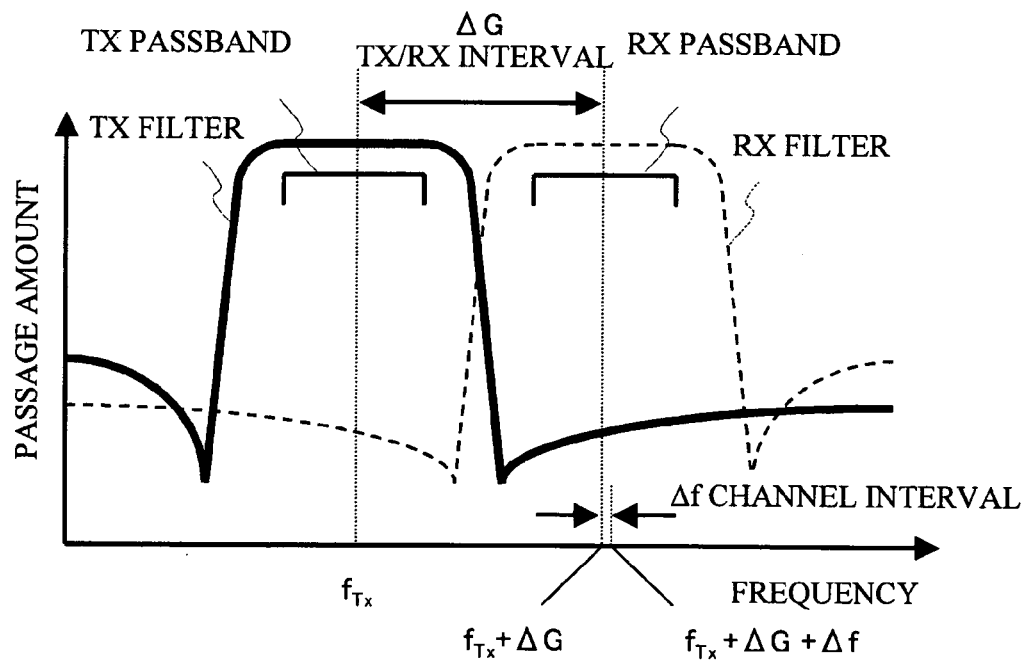
FIG. 19B shows conditions of test frequencies in the cross modulation test.

FIG. 19B shows conditions of test frequencies in the CM test. The horizontal axis denotes the frequency, and the vertical axis denotes the amount of signal passage. A solid line in FIG. 19B denotes the filter characteristic of the transmit filter 16, and a broken line denotes the filter characteristic of the receive filter 11. The transmit and receive frequency ranges of a communication system with the portable phone having the antenna duplexer are included in the pass bands of the transmit filter 16 and the receive filter 11, respectively. The parameter $\Delta G$ denotes a difference (fixed value) between the center frequency of the transmit frequency range and that of the receive frequency range. The parameter $\Delta f$ is a channel interval (equal to a few MHz) defined for each communication system. Under the above conditions, the signal spectra of the interference waves obtained at the receive terminal 15 are measured. In the CM test, the receive filter 11 is provided with not only the interference waves but also a part of the transmit signal (leaked power) that is not applied to the antenna terminal 14.

Figure 20:
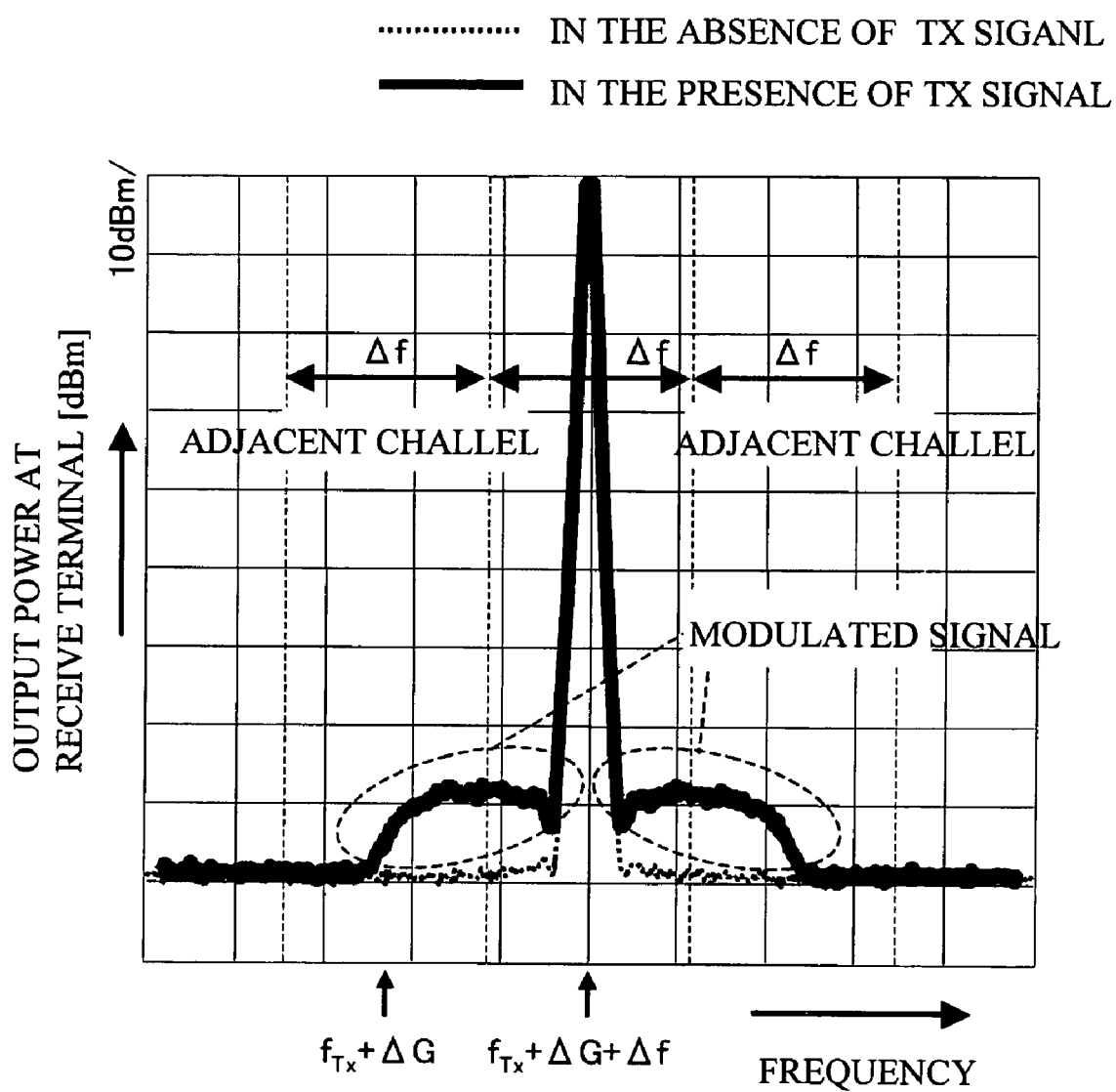
FIG. 20 shows a spectrum of interference waves observed at a receive terminal.

FIG. 20 shows a spectrum of the interference waves observed at the receive terminal 15. The horizontal axis of FIG. 20 denotes the frequency, and the vertical axis denotes the output power (dBm) measured at the receive terminal 15. A broken line in FIG. 20 denotes a spectrum of the output power at the receive terminal 15 measured in the absence of the transmit signal. This corresponds to a situation in which the receive filter 11 has no non-linearity. In this situation, a steep peak appears only at the receive frequency $f_{Tx}+\Delta G+\Delta f$ (the interference wave of this frequency). In contrast, the solid line in FIG. 20 is the spectrum of the output power obtained at the receive terminal 15 measured when the transmit signal is input. In this case, if the receive filter 11 has a non-linearity, the receive signal (interference waves) is modulated by the leakage power, and the spectrum is widen, so that a modulated signal is adversely generated. The frequency of the modulated signal extends to the adjacent channel, and the receive signal $f_{Tx}+\Delta G$ may be buried in the modulated signal. This degrades the receive sensitivity. In this manner, the non-linearity of the receive filter 11 is evaluated by the magnitude of the modulated signal. The receive filter having a small modulated signal has a small non-linearity and is suitable for the antenna duplexer.

Figure 21:
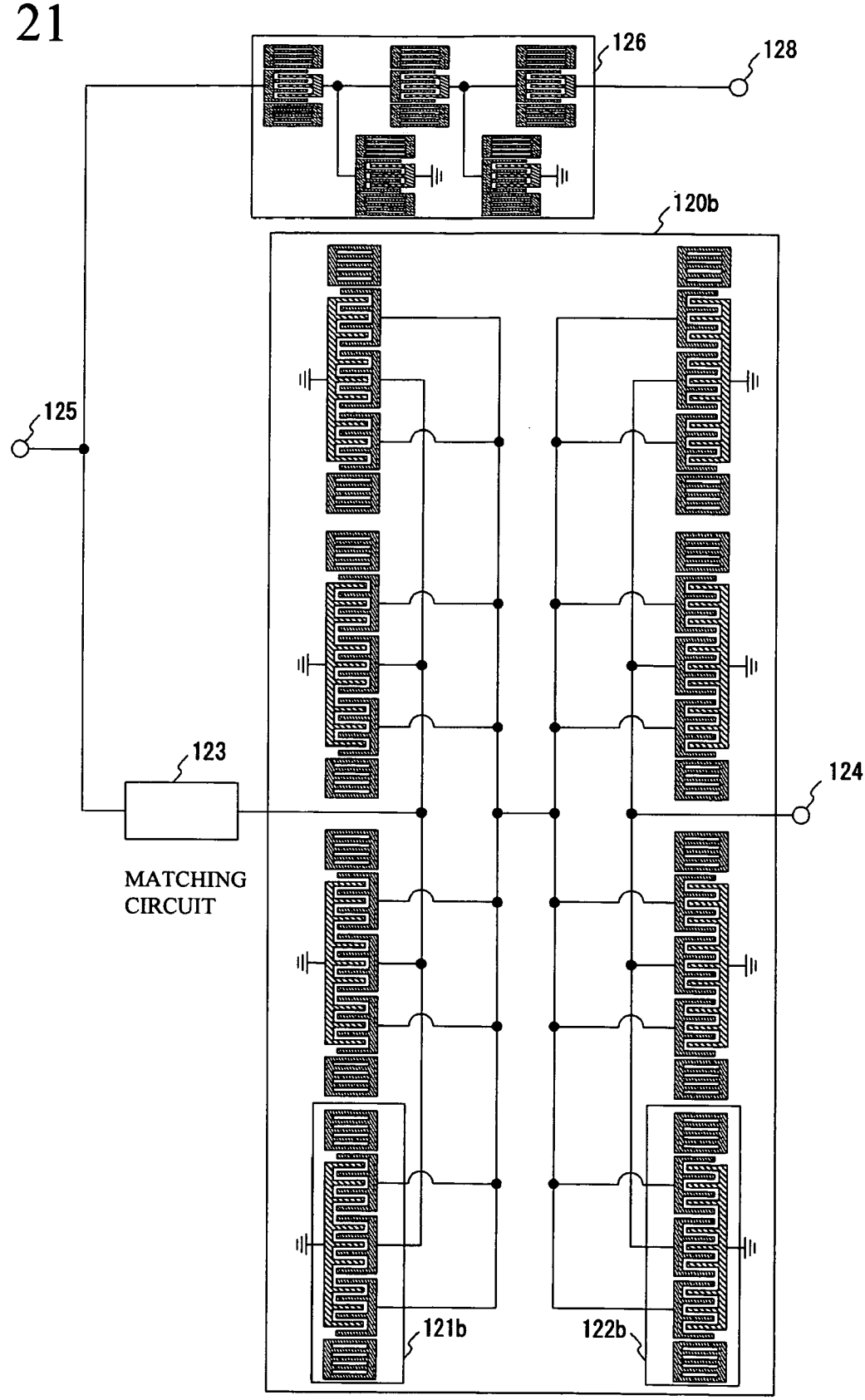
FIG. 21 shows an antenna duplexer evaluated in the cross modulation test.
Figure 22:
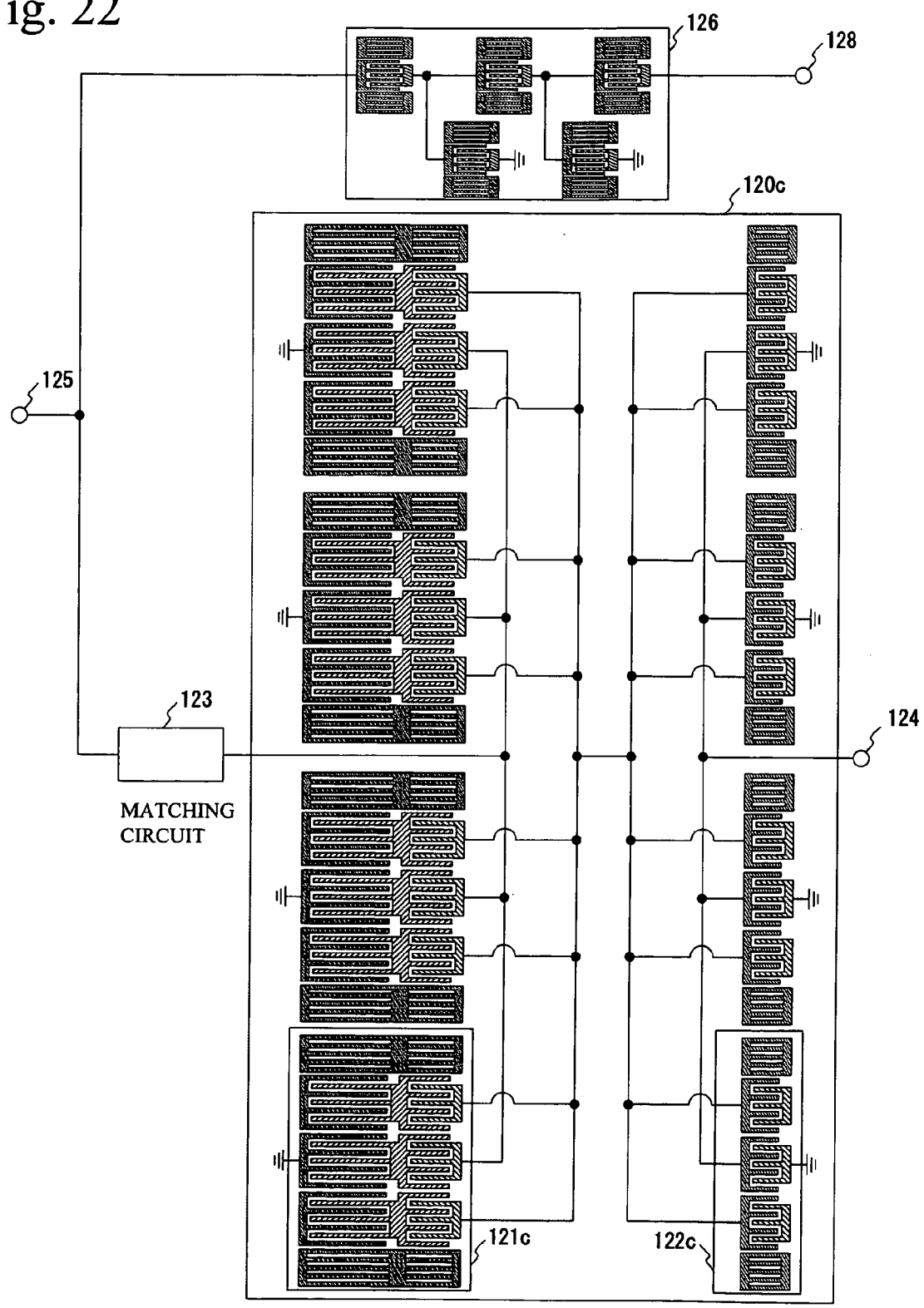
FIG. 22 shows another antenna duplexer evaluated in the cross modulation test.

In addition to the fifth embodiment, antenna duplexer shown in FIGS. 21 and 22 were evaluated by the CM test. FIG. 21 shows a conventional antenna duplexer having a receive filter 120b different from that of the fifth embodiment. The other structures of the filter shown in FIG. 21 are the same as those of the fifth embodiment. A DMS filter 121b on the input terminal side and a DMS filter 122b on the output terminal side are both the conventional DMS filters that do not have the series fragmentation. The antenna duplexer shown in FIG. 22 (comparative filter) has a receiver filter 120c different from that of the fifth embodiment, and the other structures thereof are the same as those of the fifth embodiment. A DMS filter 121c on the input terminal side is the comparative DMS filter shown in FIG. 2B, and a DMS filter 122c on the output terminal side is the conventional DMS filter shown in FIG. 2A, in which each IDT is composed of only a pair of comb-like electrodes.

Figure 23:
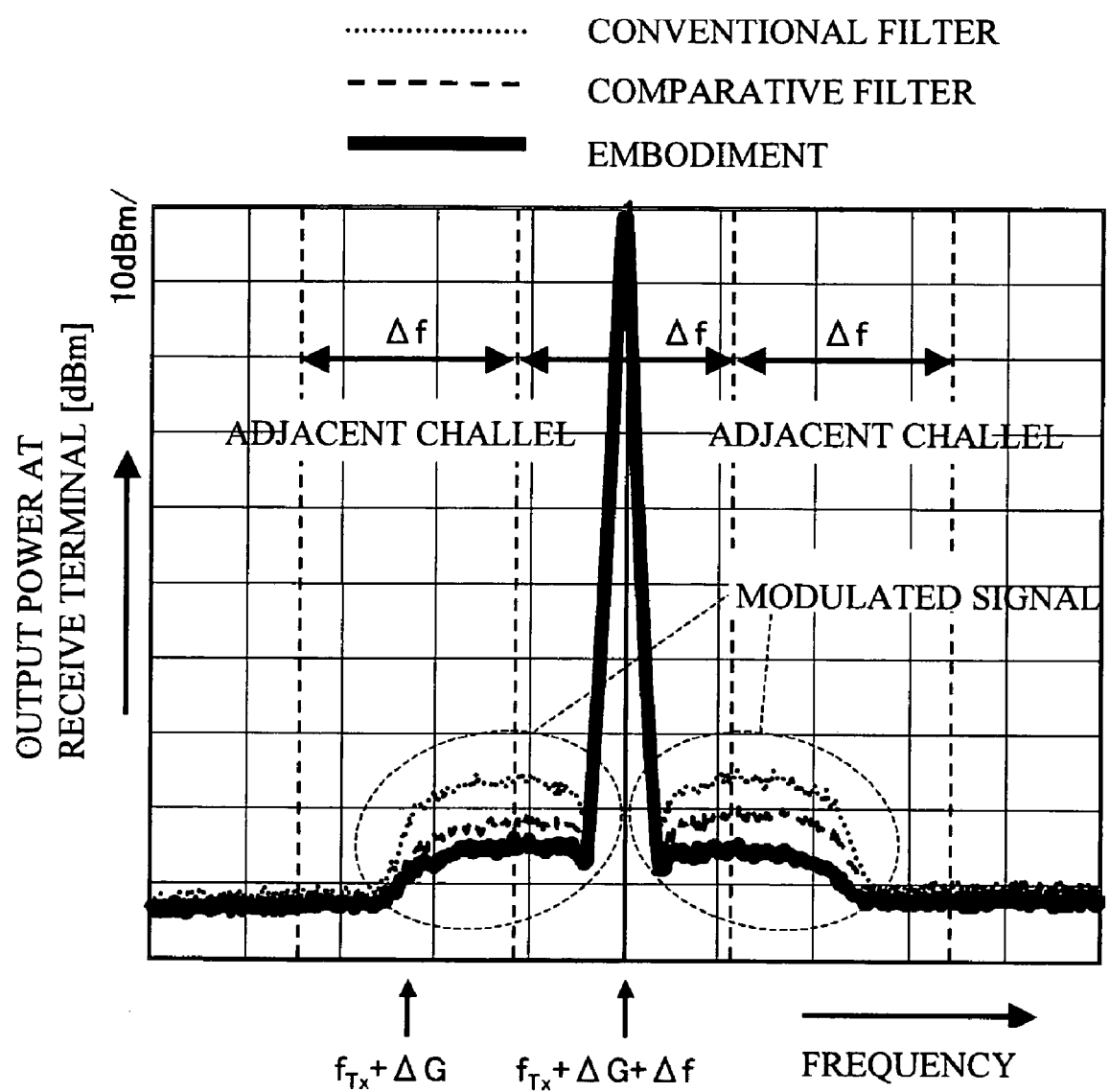
FIG. 23 shows the results of the cross modulation test.

FIG. 23 shows the results of the CM test. The horizontal axis denotes the frequency, and the vertical axis denotes the output power available at the receive terminal. A dotted line, a broken line and a solid line in FIG. 23 denote spectra of the output powers at the receive terminals of the conventional filter, the comparative filter and the fifth embodiment, respectively. The transmit frequency used in the test was the lowest frequency in the transmission frequency range. The antenna duplexer of the fifth embodiment has the mostly improved modulated signal intensity for the adjacent channel. This is because the aperture lengths of the two IDTs connected in series are equal to 2.0×AP, whereby a reduced voltage can be applied to each IDT and the SAW intensity excited per unit area can be reduced. This makes it difficult to cause the non-linearity.

Figure 24A:
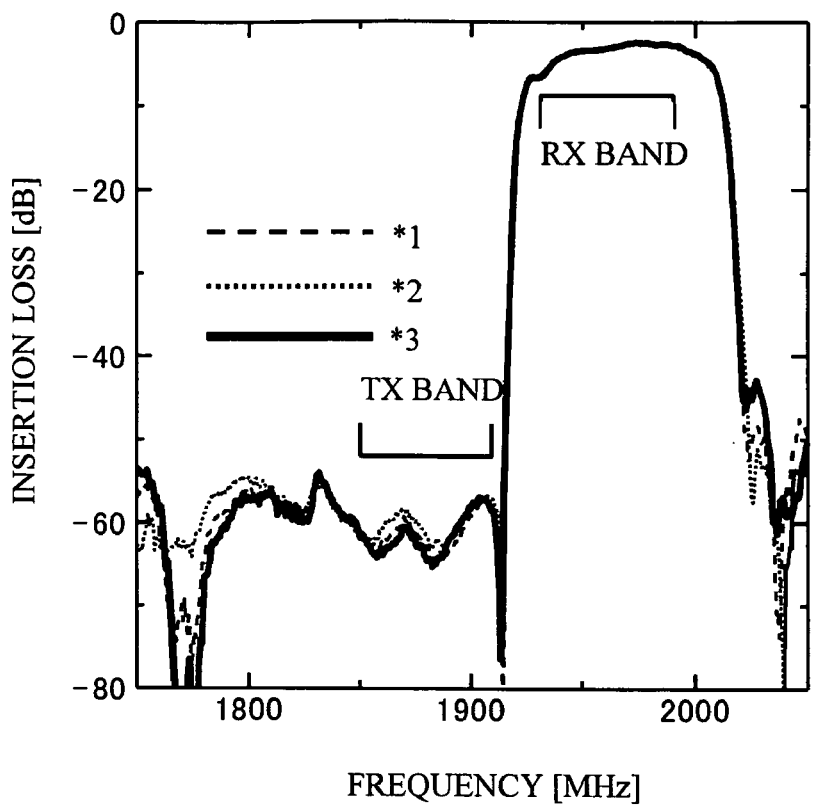
FIGS. 24A and 24B show pass band characteristics of the antenna duplexers evaluated by the cross modulation test.
Figure 24B:
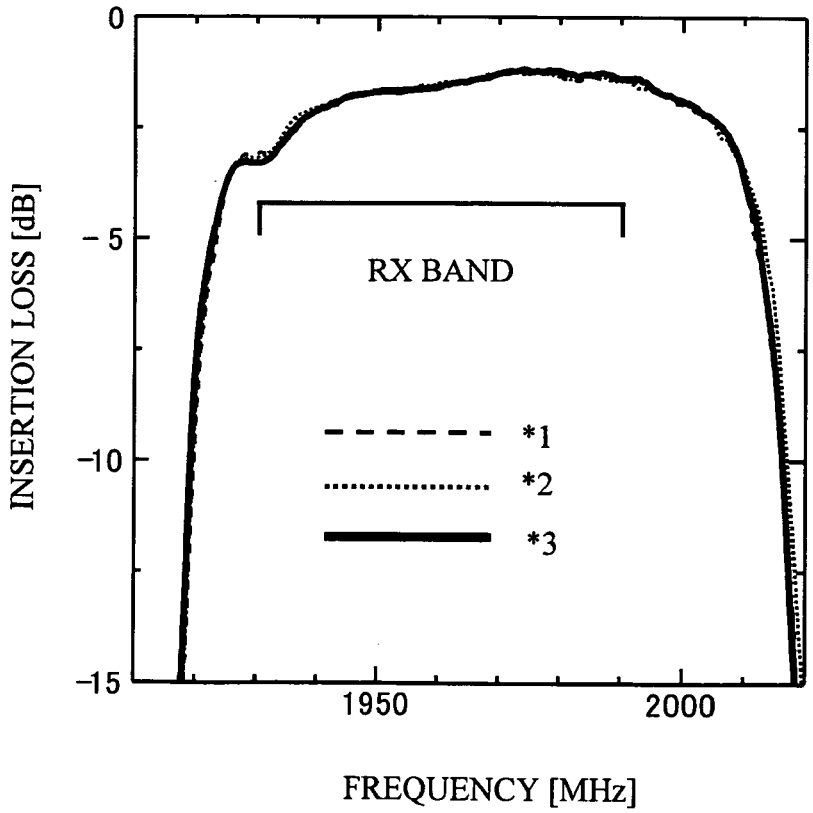

FIGS. 24A and 24B show pass band characteristics of the above-mentioned three different antenna duplexers. FIG. 24B is an enlarged view of the receive band in FIG. 24A. The insertion losses of the conventional filter, comparative filter and fifth embodiment are illustrated by a dotted line, broken line and solid line. The antenna duplexer of the fifth embodiment has no notch in the pass band and exhibits filter characteristics equivalent to those of the conventional and comparative filters.

From the above-mentioned experimental results, it is confirmed that the power durability and non-linearity of the antenna duplexer can be improved by the DMS filter 121a on the input terminal side of the receive filter 120a having the multiple IDTs connected in series. Further, the electrostatic capacitances between the adjacent floating conductors of the DMS filter 121a can be reduced and the non-linearity in the pass band of the antenna duplexer can be suppressed by the arrangement in which one of the adjacent electrode fingers between the adjacent IDTs of the DMS filter 121a is connected to the floating conductor and the other is connected to a conductor other than the floating conductor (the input/output electrode or the ground electrode). It is thus possible to set the aperture lengths of the IDTs of the DMS filter 120a connected in series by the series fragmentation equal to each other (AP1=AP2) at which the mostly improved power durability and the most suppressed non-linearity. According to the fifth embodiment, it is possible to improve the power durability and suppress the non-linearity without degrading the filter characteristics of the antenna duplexer.

In the fifth embodiment, the filter of the fourth embodiment is applied to the receive filter 120a. Alternatively, the first embodiment, its variations, the second embodiment or the third embodiment may be applied to the receive filter 120a, and advantages similar to the above can be obtained in these cases.

Sixth Embodiment

Figure 25:
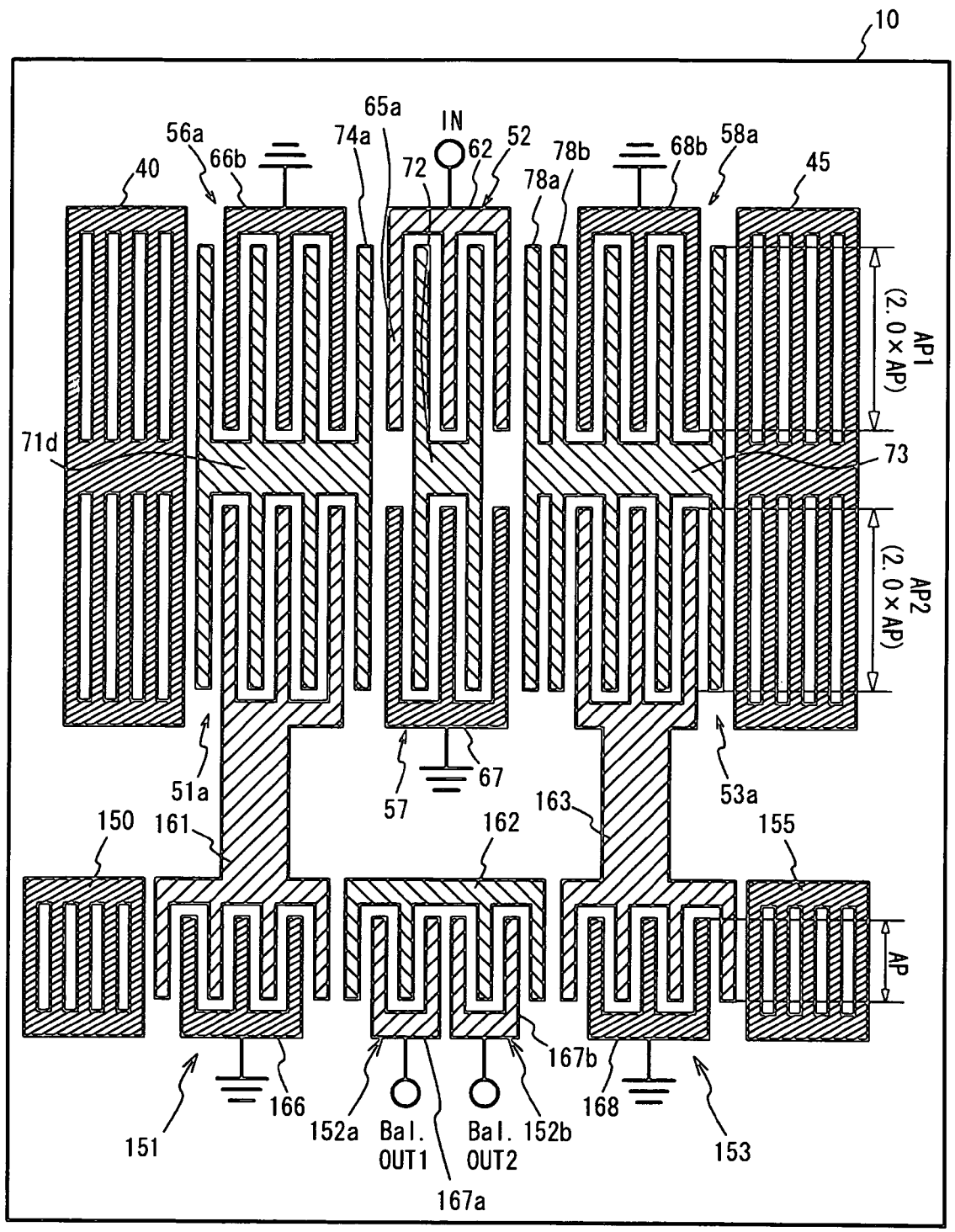
FIG. 25 shows a sixth embodiment of the present invention.

A sixth embodiment is a balanced type SAW filter. FIG. 25 is a top view of the sixth embodiment. An upper portion of the sixth embodiment is configured so that the floating conductor 71 on the left-hand side in the sixth variation of the first embodiment is replaced by a floating conductor 71d, and the input/output electrodes 61a and 63a are changed to floating conductors 161 and 163. The other structures of the sixth embodiment are the same as those of the sixth variation of the first embodiment. Between the reflectors 150 and 155, the floating conductor 161 and a ground electrode 166 form an IDT 151, and a floating conductor 163 and a ground electrode 168 form an IDT 153. Between the IDTs 151 and 153, there are provided IDTs 152a and 152b composed of floating conductors 162 and input/output electrodes 167a and 167b, to which a balanced output terminal 1 and a balanced output terminal 2 are connected, respectively.

Only one electrode finger 74a of the floating conductor 71d on the left-hand side is adjacent to the IDTs 52 and 57 at the center. In contrast, two electrode fingers 78a and 78b of the floating conductor 73 on the right-hand side are adjacent to the IDT 52 at the center. Thus, the signals respectively excited by the IDTs 151 and 153 are 180° out of phase. Thus, the signals excited by the IDTs 152a and 152b are also 180° out of phase. Thus, the signals available at the balanced output terminals 1 and 2 are 180° out of phase, so that the filter of the sixth embodiment functions as a balanced type filter.

As in the case of the sixth variation of the first embodiment, one of the adjacent electrode fingers between the adjacent IDTs is connected to the floating conductor and the other is connected to a conductor other than the floating conductor (the input/output electrode or ground electrode). It is thus possible to reduce the electrostatic capacitance between the floating conductors 71d and 72 and that between the floating conductors 72 and 73 and to suppress the notch in the pass band.

Seventh Embodiment

Figure 26:
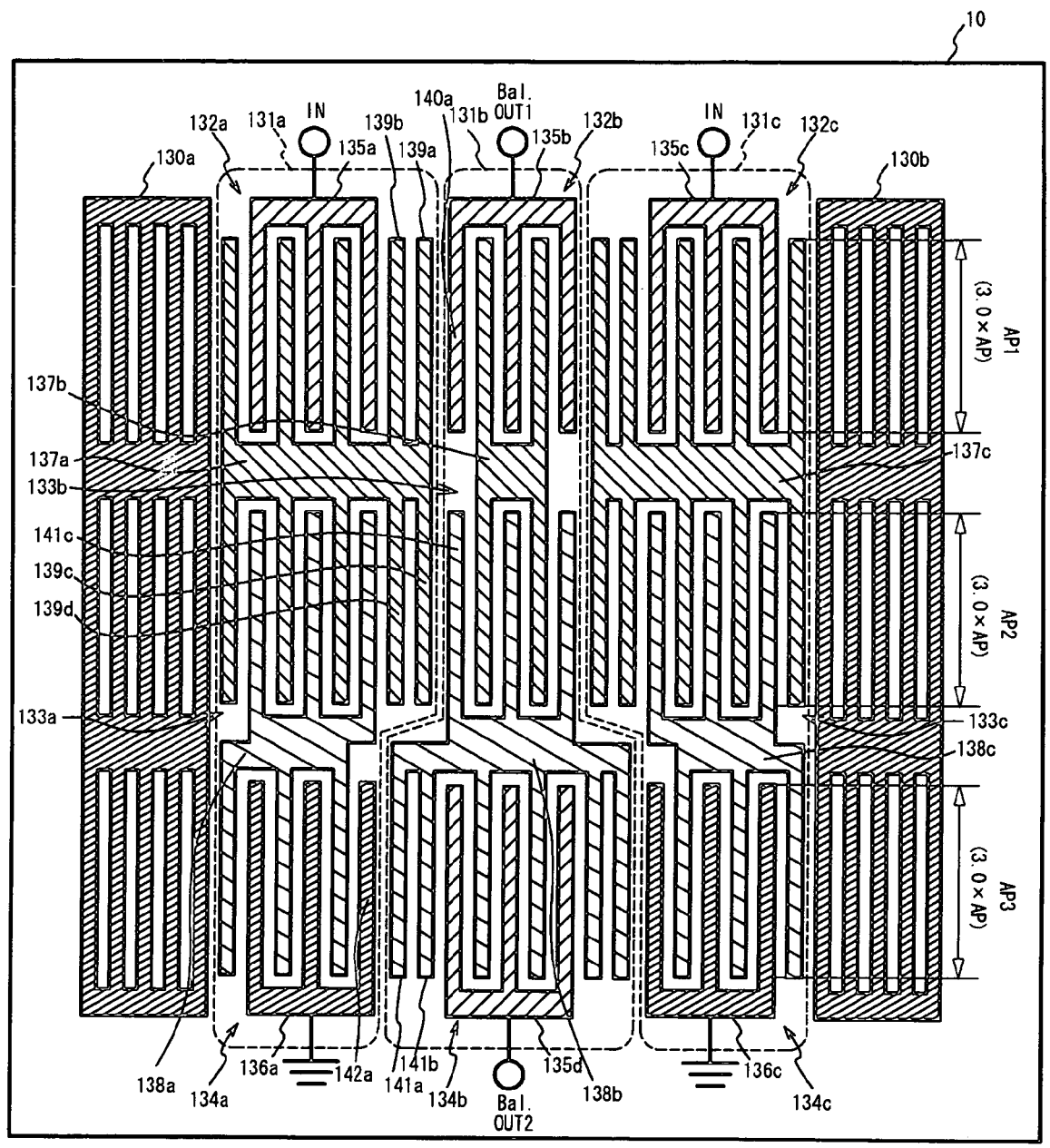
FIG. 26 shows a seventh embodiment of the present invention.

A seventh embodiment is a balanced type SAW filter in which each IDT group is composed of three IDTs connected in series. FIG. 26 shows the seventh embodiment, in which the input/output electrodes 135a and 135c of the second embodiment are connected to the input terminals, and the input/output electrode 135b thereof is connected to the balanced output terminal 1, the ground electrode 134b thereof being replaced with the input/output electrode 135d and being connected to the balanced output terminal 2. The other structures of the seventh embodiment are the same as those of the second embodiment. The input/output electrode 135b and the floating conductor 137b are 180° out of phase, and the floating conductors 137b and 138b are 180° out of phase. Further, the floating conductor 138b and the input/output electrode 135c are 180° out of phase. Thus, the balanced output terminal 1 connected to the input/output electrode 135b and the balanced output terminal 2 connected to the input/output electrode 135d are 180° out of phase, and the filter of the seventh embodiment functions as the balanced type filter.

As in the case of the second embodiment, one of the adjacent electrode fingers between the adjacent IDTs is connected to the floating conductor and the other is connected to a conductor other than the floating conductor (the input/output electrode or ground electrode). It is thus possible to suppress the notch in the pass band and to improve the power durability and suppress the non-linearity without degrading the filter characteristics.

As in the case of the sixth or seventh embodiment, the balanced type SAW filter may be formed by employing any of the first embodiment, its variations, the second, third or fourth embodiment. It is thus possible to improve the power durability and suppress the non-linearity without degrading the filter characteristics. The antenna duplexer with the balanced type SAW filter of the present invention has improved power durability and suppressed non-linearity in the absence of degradation of the filter characteristics.

The present invention is not limited to the specifically described embodiments and variations thereof, but other embodiments and variations may be made without departing from the scope of the present invention.

The present invention is based on Japanese Patent Application No. 2005-130988 filed on Apr. 28, 2005, and the entire disclosure of which is hereby incorporated by reference.

What is claimed is:

1. A multimode type SAW filter comprising:
a piezoelectric substrate; and
IDT groups formed on the piezoelectric substrate, the IDT groups each having multiple IDTs connected in series in which an input/output electrode and a ground electrode are coupled via a floating conductor,
adjacent electrode fingers between adjacent IDTs among the multiple IDTs of the IDT groups including a first electrode finger connected to the floating conductor in one of the IDT groups and a second electrode finger connected to one of the input/output electrode and the ground electrode in another one of the IDT groups.

2. The multimode type SAW filter as claim 1, further comprising a third electrode finger that is adjacent to one of the first and second electrode fingers and has a potential equal to that of said one of the first and second electrode fingers.

3. The multimode type SAW filter as claimed in claim 2, wherein the first and the third electrode fingers are connected to the floating conductor.

4. The multimode type SAW filter as claimed in claim 1, wherein the adjacent IDTs are arranged in a SAW propagation direction.

5. The multimode type SAW filter as claimed in claim 1, wherein all the multiple IDTs in each of the IDT groups are connected in series via the floating conductor interposed between the input/output electrode and the ground electrode.

6. The multimode type SAW filter as claimed in claim 1, wherein electrode finger patterns of two IDTs among the multiple IDTs connected in series in each of the IDT groups have a mirror symmetry with respect to an axis in a SAW propagation direction.

7. The multimode type SAW filter as claimed in claim 1, wherein electrode finger patterns of two IDTs among the multiple IDTs connected in series in each of the IDT groups are shifted in parallel in a direction perpendicular to a SAW propagation direction.

8. The multimode type SAW filter as claimed in claim 1, wherein two IDTs among the multiple IDTs connected in series have an equal aperture length.

9. The multimode type SAW filter as claimed in claim 1, wherein the input/output electrodes of the IDT groups each connected to either an input terminal or an output terminal are provided in an identical direction.

10. The multimode type SAW filter as claimed in claim 9, wherein the ground electrodes of the IDT groups are connected on the piezoelectric substrate.

11. The multimode type SAW filter as claimed in claim 10, wherein electrode fingers of the ground electrodes of the IDT groups are connected to a single ground bus bar.

12. The multimode type SAW filter as claimed in claim 1, wherein the input/output electrodes of the IDT groups each connected to either an input terminal or an output terminal are provided in different directions.

13. The multimode type SAW filter as claimed in claim 1, further comprising electrode fingers that are provided between connecting lines of adjacent floating conductors of adjacent IDT groups among the IDT groups and are isolated from the adjacent floating conductors.

14. The multimode type SAW filter as claimed in claim 1, wherein the IDT groups include first, second and third IDT groups, which have first, second and third IDTs arranged side by side in a SAW propagation direction.

15. The multimode type SAW filter as claimed in claim 14, further comprising electrode fingers at an equal potential between the first and second IDTs, and electrode fingers at an equal potential between the second and third IDTs.

16. The multimode type SAW filter as claimed in claim 15, wherein the electrode fingers at the equal potential between the first and second IDTs are connected to each other, and the electrode fingers at the equal potential between the second and third IDTs are connected to each other.

17. The multimode type SAW filter as claimed in claim 15, wherein the electrode fingers at the equal potential between the first and second IDTs are connected to a conductor, and the electrode fingers at the equal potential between the second and third IDTs are connected to another conductor at a potential different from that of said conductor.

18. The multimode type SAW filter as claimed in claim 14, wherein the input/output electrodes of the first and third IDTs are connected to an input terminal, and the input/output electrode of the second IDT is connected to an output terminal.

19. The multimode type SAW filter as claimed in claim 1, wherein the multimode type SAW filter is a balanced type filter.

20. A multimode type SAW filter comprising:
a first filter; and
a second filter that follows the first filter and is a multimode type SAW filter,
the first filter including:
IDT groups formed on the piezoelectric substrate, the IDT groups each having multiple IDTs connected in series in which an input/output electrode and a ground electrode are coupled via a floating conductor,
adjacent electrode fingers between adjacent IDTs among the multiple IDTs of the IDT groups including a first electrode finger connected to the floating conductor in one of the IDT groups and a second electrode finger connected to one of the input/output electrode and the ground electrode in another one of the IDT groups.

21. The multimode type SAW filter as claimed in claim 20, wherein the second filter includes IDTs, each of which is composed of only a pair of comb-like electrodes.

22. A multimode type SAW filter comprising:
a piezoelectric substrate;
multiple filters connected in parallel and formed on the piezoelectric substrate;
each of the multiple filters including:
IDT groups formed on the piezoelectric substrate, the IDT groups each having multiple IDTs connected in series in which an input/output electrode and a ground electrode are coupled via a floating conductor,
adjacent electrode fingers between adjacent IDTs among the multiple IDTs of the IDT groups including a first electrode finger connected to the floating conductor in one of the IDT groups and a second electrode finger connected to one of the input/output electrode and the ground electrode in another one of the IDT groups.

23. An antenna duplexer comprising:
a transmit filter connected to a common terminal; and
a receive filter connected to the common terminal,
the receive filter including:
a piezoelectric substrate; and
IDT groups formed on the piezoelectric substrate, the IDT groups each having multiple IDTs connected in series in which an input/output electrode and a ground electrode are coupled via a floating conductor,
adjacent electrode fingers between adjacent IDTs among the multiple IDTs of the IDT groups including a first electrode finger connected to the floating conductor in one of the IDT groups and a second electrode finger connected to one of the input/output electrode and the ground electrode in another one of the IDT groups.

* * * * *